US012190985B2

(12) United States Patent
Cao et al.

(10) Patent No.: US 12,190,985 B2
(45) Date of Patent: Jan. 7, 2025

(54) SENSE AMPLIFIER CIRCUIT, MEMORY DEVICE, AND OPERATION METHOD THEREOF

(71) Applicant: CHANGXIN MEMORY TECHNOLOGIES, INC., Hefei (CN)

(72) Inventors: Kanyu Cao, Hefei (CN); Weibing Shang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 191 days.

(21) Appl. No.: 17/741,722

(22) Filed: May 11, 2022

(65) Prior Publication Data

US 2022/0270653 A1    Aug. 25, 2022

Related U.S. Application Data

(63) Continuation of application No. PCT/CN2020/074385, filed on Feb. 6, 2020.

(51) Int. Cl.
   *G11C 7/06*      (2006.01)
   *G11C 7/08*      (2006.01)
   *G11C 7/12*      (2006.01)

(52) U.S. Cl.
   CPC ............... *G11C 7/062* (2013.01); *G11C 7/08* (2013.01); *G11C 7/12* (2013.01)

(58) Field of Classification Search
   CPC .. G11C 7/062; G11C 7/08; G11C 7/12; G11C 11/4091; H03F 2203/45562;
   (Continued)

(56) References Cited

U.S. PATENT DOCUMENTS 3,518,453 A * 6/1970 Carruthers, Sr. ....... H03F 3/387
                                               327/482
7,729,189 B2    6/2010 Forbes
                   (Continued)

FOREIGN PATENT DOCUMENTS

CN          1909108 A      2/2007
CN        101937701 A      1/2011
                   (Continued)

OTHER PUBLICATIONS

Supplementary European Search Report in the European application No. 20917463.0, mailed on Oct. 4, 2022, 9 pgs.
(Continued)

*Primary Examiner* — Khamdan N. Alrobaie
(74) *Attorney, Agent, or Firm* — Kilpatrick Townsend & Stockton LLP

(57) ABSTRACT

A sense amplifier circuit, memory device and related operation methods are provided. The sense amplifier circuit includes an amplification circuit for amplifying a voltage signal and a compensation circuit coupled to the amplification circuit. The amplification circuit includes a first inverting amplifier and a second inverting amplifier cross-coupled with each other, with the first inverting amplifier connected to a first bitline and the second inverting amplifier connected to a second bitline. The compensation circuit includes a first, a second, a third, and a fourth switch circuits, and is configured to generate a compensation voltage between the first bitline and the second bitline by conducting charge injections through operating the switch circuits to compensate an input-referred offset voltage of the amplification circuit.

49 Claims, 16 Drawing Sheets

(58) Field of Classification Search
CPC . H03F 2203/45588; H03F 2203/45614; H03F 3/45968; H03F 3/45744
See application file for complete search history.

(56) References Cited

U.S. PATENT DOCUMENTS

| | | | |
|---|---|---|---|
| 8,233,343 | B2 | 7/2012 | Moon |
| 8,339,195 | B2 | 12/2012 | Lee |
| 8,362,807 | B2 | 1/2013 | Upputuri |
| 9,322,859 | B2 | 4/2016 | Upputuri et al. |
| 9,378,781 | B1 | 6/2016 | Jung et al. |
| 9,509,255 | B2 | 11/2016 | Upputuri et al. |
| 9,691,462 | B2 | 6/2017 | Jung et al. |
| 10,074,408 | B2 * | 9/2018 | Seo ................... G11C 11/4091 |
| 10,839,873 | B1 * | 11/2020 | Lee ...................... G11C 7/1048 |
| 11,894,047 | B2 * | 2/2024 | Peng ................... G11C 11/4091 |
| 2005/0226070 | A1 * | 10/2005 | Ohsawa .............. G11C 11/4091 365/207 |
| 2007/0024325 | A1 | 2/2007 | Chen |
| 2010/0329056 | A1 * | 12/2010 | Moon ................. G11C 11/4094 365/207 |
| 2011/0140773 | A1 * | 6/2011 | Lee ...................... G11C 29/026 330/102 |
| 2012/0092072 | A1 | 4/2012 | Upputuri |
| 2013/0113552 | A1 | 5/2013 | Upputuri et al. |
| 2013/0294179 | A1 | 11/2013 | Lee et al. |
| 2015/0036444 | A1 * | 2/2015 | Seo .................... G11C 11/4091 365/210.1 |
| 2016/0093350 | A1 | 3/2016 | Jung et al. |
| 2016/0118945 | A1 | 4/2016 | Upputuri et al. |
| 2017/0069368 | A1 | 3/2017 | Woo et al. |
| 2018/0061461 | A1 | 3/2018 | Seo |
| 2021/0020210 | A1 * | 1/2021 | Lee ......................... G11C 7/062 |
| 2022/0013152 | A1 * | 1/2022 | Cao ......................... G11C 7/065 |
| 2022/0029586 | A1 * | 1/2022 | Wu ...................... G11C 11/4091 |
| 2022/0051713 | A1 * | 2/2022 | Lu ....................... G11C 11/4094 |
| 2022/0068357 | A1 * | 3/2022 | Lin ...................... G11C 11/4074 |
| 2022/0208235 | A1 * | 6/2022 | Peng ......................... G11C 7/02 |
| 2022/0270653 | A1 * | 8/2022 | Cao ........................... G11C 7/08 |

FOREIGN PATENT DOCUMENTS

| | | |
|---|---|---|
| CN | 102446537 A | 5/2012 |
| CN | 107995991 A | 5/2018 |

OTHER PUBLICATIONS

Moon< et al., "Sense Amplifier with Offset Mismatch Calibration for Sub 1-V DRAM Core Operation" IEEE International Symposium on Circuits & Systems, May 2010, 4 pages.

Suzuki et al., "Threshold Difference Compensated Sense Amplifier" IEEE Journal of Solid-State Circuits, vol. SC-14, No. 6, Dec. 1979, 5 pages.

International Search Report cited in PCT/CN2020/074385, mailed on Nov. 10, 2020, 4 pages.

Written Opinion cited in PCT/CN2020/074385, mailed on Nov. 10, 2020, 4 pages.

Keeth, et al., "DRAM Circuit Design: A Tutorial", Jun. 2000, 214 pages.

* cited by examiner

SENSE AMPLIFIER CIRCUIT, MEMORY DEVICE, AND OPERATION METHOD THEREOF

CROSS-REFERENCE TO RELATED APPLICATION

The present disclosure is a US continuation of International Application No. PCT/CN2020/074385, filed on Feb. 6, 2020. The disclosure of International Application No. PCT/CN2020/074385 is hereby incorporated by reference in its entirety.

BACKGROUND

A sense amplifier circuit is a circuit in a semiconductor memory chip that amplifies a power signal of a memory cell. When reading data from a memory cell, the sense amplifier circuit accepts an input representing a data bit stored in the memory cell, and amplifies the input to a voltage level high enough to be recognizable by an external device so that the data bit of the memory cell can be properly read.

It is to be noted that the above information disclosed in this Background section is only for facilitating the understanding of the background of this invention and therefore may contain information that does not form the prior art that is already known to a person of ordinary skill in the art.

SUMMARY

This invention relates generally to the field of semiconductor technologies and, more specifically, to a sense amplifier circuit and its operation methods.

In view of the limitations of existing technologies described above, this disclosure provides a sense amplifier circuit, a memory device, and related operation methods that address the aforementioned limitations.

One aspect of this invention is directed to a sense amplifier circuit. The sense amplifier circuit may include an amplification circuit and a compensation circuit coupled to the amplification circuit.

The amplification circuit may include a first inverting amplifier and a second inverting amplifier. The first inverting amplifier may be connected to a first bitline, and the second inverting amplifier may be connected to a second bitline. The amplification circuit may be configured to amplify a voltage signal applied between the first bitline and the second bitline. The compensation circuit may be coupled to the amplification circuit and configured to compensate an input-referred offset voltage of the amplification circuit by conducting charge injections to at least one of the first bitline and the second bitline.

Another aspect of this invention is directed to another sense amplifier circuit. The sense amplifier circuit may include an amplification circuit and a compensation circuit. The amplification circuit may include a first inverting amplifier connected to a first bitline, and a second inverting amplifier connected to a second bitline. The amplification circuit may be configured to amplify a voltage signal applied between the first bitline and the second bitline. The compensation circuit may be coupled to the amplification circuit and configured to compensate an input-referred offset voltage of the amplification circuit. The compensation circuit may be configured to conduct a charging operation to charge at least one of the first bitline and the second bitline. At the end of the charging operation, a voltage difference between near-ends of the first bitline and the second bitline may be larger than the input-referred offset voltage of the amplification circuit.

Another aspect of this invention is directed to yet another sense amplifier circuit. The sense amplifier circuit may include an amplification circuit and a compensation circuit. The amplification circuit may include a first inverting amplifier connected to a first bitline, and a second inverting amplifier connected to a second bitline. The amplification circuit may be configured to amplify a voltage signal applied between the first bitline and the second bitline during a signal amplification stage. The compensation circuit may be coupled to the first bitline, the second bitline, and the amplification circuit, and may be configured to compensate an input-referred offset voltage of the amplification circuit during an offset compensation stage. At least one of the first bitline and the second bitline may be connected, through the compensation circuit, to one of the outputs of the first inverting amplifier and the second inverting amplifier during the signal amplification stage, and the at least one of the first bitline and the second bitline may be connected to the other of the outputs of the first inverting amplifier and the second inverting amplifier during the offset compensation stage.

Another aspect of this invention is directed to yet another sense amplifier circuit. The sense amplifier circuit may include an amplification circuit and a compensation circuit. The amplification circuit may include a first inverting amplifier connected to a first bitline, and a second inverting amplifier connected to a second bitline. The amplification circuit may be configured to amplify a voltage signal applied between the first bitline and the second bitline during a signal amplification stage. The compensation circuit may be coupled to the amplification circuit, and may be configured to compensate an input-referred offset voltage of the amplification circuit during an offset compensation stage. A gain of the sense amplifier circuit may be larger than one during the offset compensation stage.

Another aspect of this invention is directed to yet another sense amplifier circuit. The sense amplifier circuit may include an amplification circuit and a compensation circuit. The amplification circuit may include a first inverting amplifier connected to a first bitline, and a second inverting amplifier connected to a second bitline. The amplification circuit may be configured to amplify a voltage signal applied between the first bitline and the second bitline during a signal amplification stage. The compensation circuit may be coupled to the amplification circuit, and may be configured to compensate an input-referred offset voltage of the amplification circuit during an offset compensation stage. The first inverting amplifier and the second inverting amplifier may be cross-coupled during the offset compensation stage.

Another aspect of this invention is directed to a memory device. The memory device may include a plurality of memory cells and a plurality of sense amplifier circuits. Each of the plurality of sense amplifier circuits may be the sense amplifier circuit of any of the aforementioned embodiments, and may be connected to one of the plurality of memory cells.

Another aspect of this invention is direct to an input-referred offset voltage compensation method, applicable to the sense amplifier circuit of any of the aforementioned embodiments. The method may include generating, by operating the first, the second, the third, and the fourth switch circuits, a compensation voltage between the first bitline and the second bitline to compensate the input-referred offset voltage of the amplification circuit.

Another aspect of this invention is directed to an input-referred offset voltage compensation method, applicable to an amplifier circuit. The method may include: connecting, through a control circuit coupled to the amplifier circuit, a first node of the amplifier circuit with a second node of the amplifier circuit to cause voltages on the first node and the second node to converge; separating, through the control circuit, the first node from the second node; determining a time of compensation; powering on the amplifier circuit for the time of compensation to generate a first signal and a second signal, wherein the first signal is generated at the first node, and the second signal is generated at the second node; and routing, through the control circuit, the first signal to the second node, and the second signal to the first node to compensate an input-referred offset voltage of the amplifier circuit.

Another aspect of this invention is directed to a method to operate a sense amplifier circuit. The sense amplifier circuit may be connected to a first bitline through a first bitline switch circuit, and connected to a second bitline through a second bitline switch circuit. The sense amplifier circuit may be configured to amplify a voltage signal applied between the first bitline and the second bitline. The method may include: while the sense amplifier circuit amplifying the voltage signal, disconnecting the sense amplifier circuit from the first bitline and the second bitline by operating the first bitline switch circuit and the second bitline switch circuit; keeping the sense amplifier circuit disconnected from the first bitline and the second bitline for a predetermined period of time; and reconnecting the sense amplifier circuit with the first bitline and the second bitline by operating the first bitline switch circuit and the second bitline switch circuit.

Another aspect of this invention is directed to a memory device operation method, applicable to a memory device. The method may include: conducing the aforementioned input-referred offset voltage compensation method on a plurality of amplifier circuits arranged on a first side of a wordline of the memory device; and conducting the aforementioned input-referred offset voltage compensation method on a plurality of amplifier circuits arranged on a second side of the wordline of the memory device. The second side may be opposing the first side.

Another aspect of this invention is directed to an input-referred offset voltage compensation method, applicable to an amplification circuit having a first sub-circuit and a second sub-circuit, and having an input-referred offset voltage. The method may include: generating, in response to a voltage signal, a first signal by the first sub-circuit on a first I/O of the amplification circuit, and a second signal by the second sub-circuit on a second I/O of the amplification circuit. A difference between the first signal and the second signal may reflect the input-referred offset voltage in the circuit. The method may further include connecting, by a compensation circuit coupled to the amplification circuit, the first signal to the second I/O, and the second signal to the first I/O to compensate the input-referred offset voltage.

It is to be understood that both the foregoing general description and the following detailed description are exemplary and explanatory only and are not restrictive of this invention.

BRIEF DESCRIPTION OF THE DRAWINGS

The accompanying drawings, which are incorporated in and constitute a part of the description, illustrate embodiments consistent with this invention and, together with the description, serve to explain the disclosed principles. It is apparent that these drawings present only some embodiments of this invention and those of ordinary skill in the art may obtain drawings of other embodiments from them without exerting any creative effort.

Modern memory devices are increasingly miniaturized in size and power consumption, and the amount of electric charge in individual memory cell is only capable of generating a signal of small magnitude for representing data in the memory cell. Therefore a sense amplifier circuit that can properly amplify small input signals is of vital importance in modern memory devices.

However, due to inevitable variation in circuit characteristics, there exists an offset voltage in the sense amplifier circuit that may reduce the sensitivity of the sense amplifier circuit and the performance of the associated memory cell. Due to the offset voltage, a voltage difference between two bitlines of a sense amplifier circuit must be larger than a minimum voltage, known as minimum voltage margin, for a sense amplifier circuit to work properly. In other words, a sense amplifier circuit with an offset voltage may require a larger input signal than what is otherwise needed to produce a recognizable voltage level. Additionally, voltage pulling capabilities between the pull-up circuit and the pull-down circuit of a sense amplifier circuit may be different, which may also impact the performance of a sense amplifier circuit. Therefore, a sense amplifier circuit that can remedy the aforementioned deficiencies, including the offset voltage, is desired.

Figure 1A:
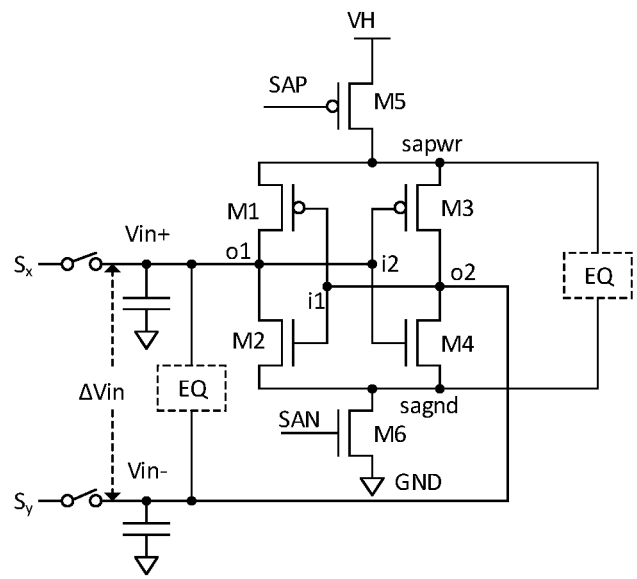

FIG. 1A shows a conventional sense amplifier circuit.

Figure 1B:
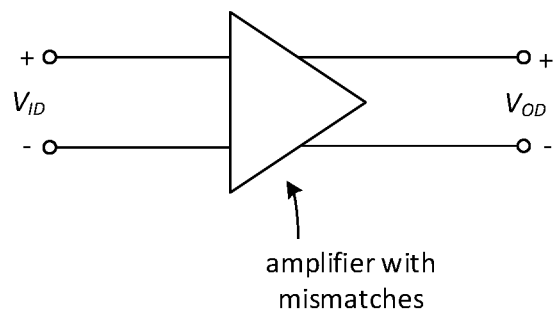
Figure 1C:
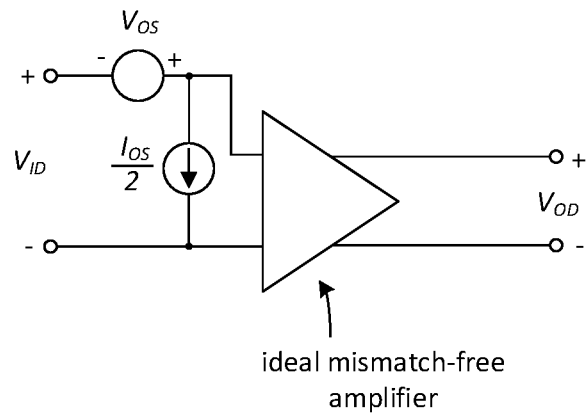

FIGS. 1B and 1C show circuit diagrams illustrating, respectively, an sense amplifier circuit containing mismatches and an equivalent circuit including a mismatch-free sense amplifier circuit, an input-referred offset voltage source and an input-referred offset current source.

Figure 2A:
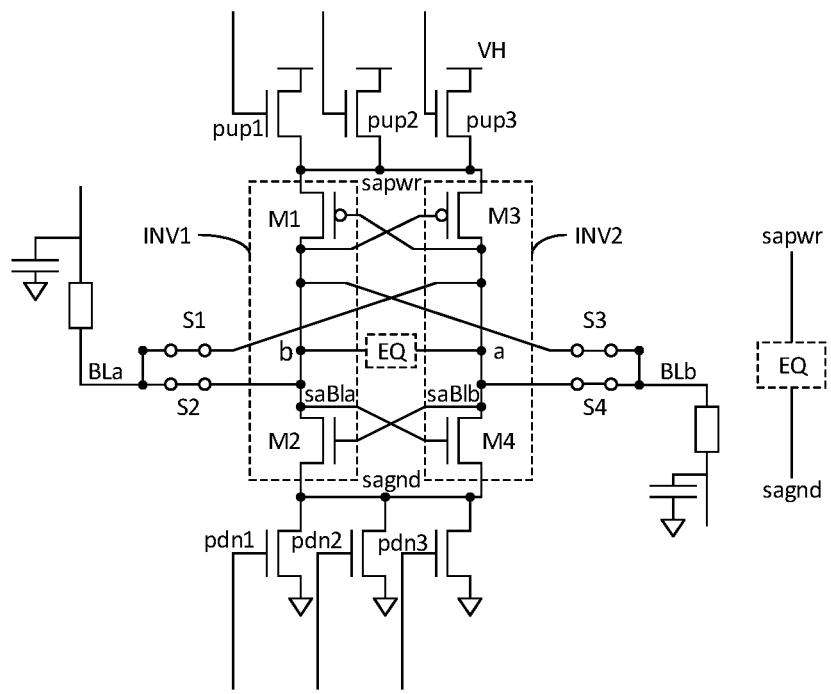
Figure 2B:
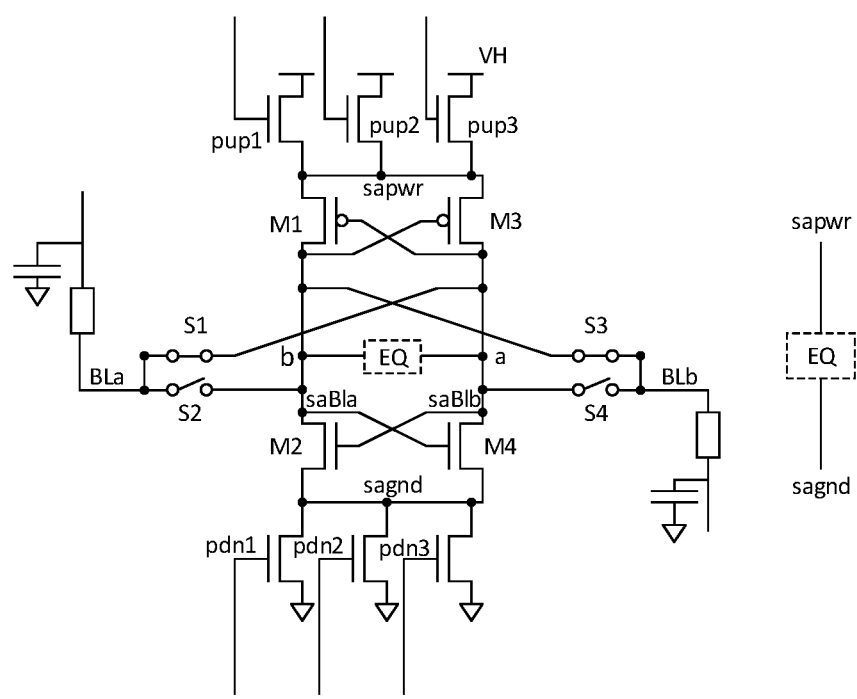
Figure 2C:
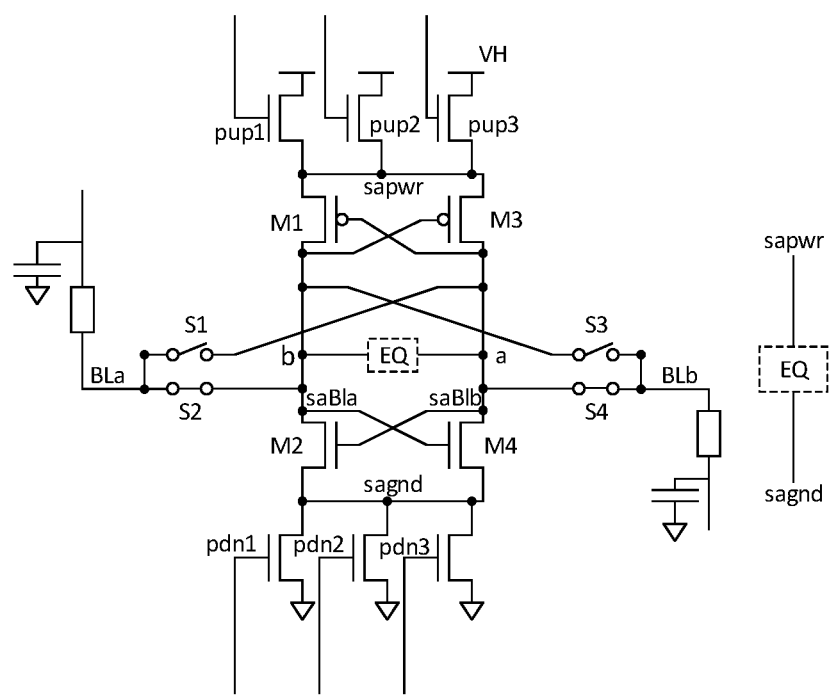

FIGS. 2A, 2B, and 2C show different operation stages of a sense amplifier circuit in accordance with one embodiment of this invention.

Figure 3:
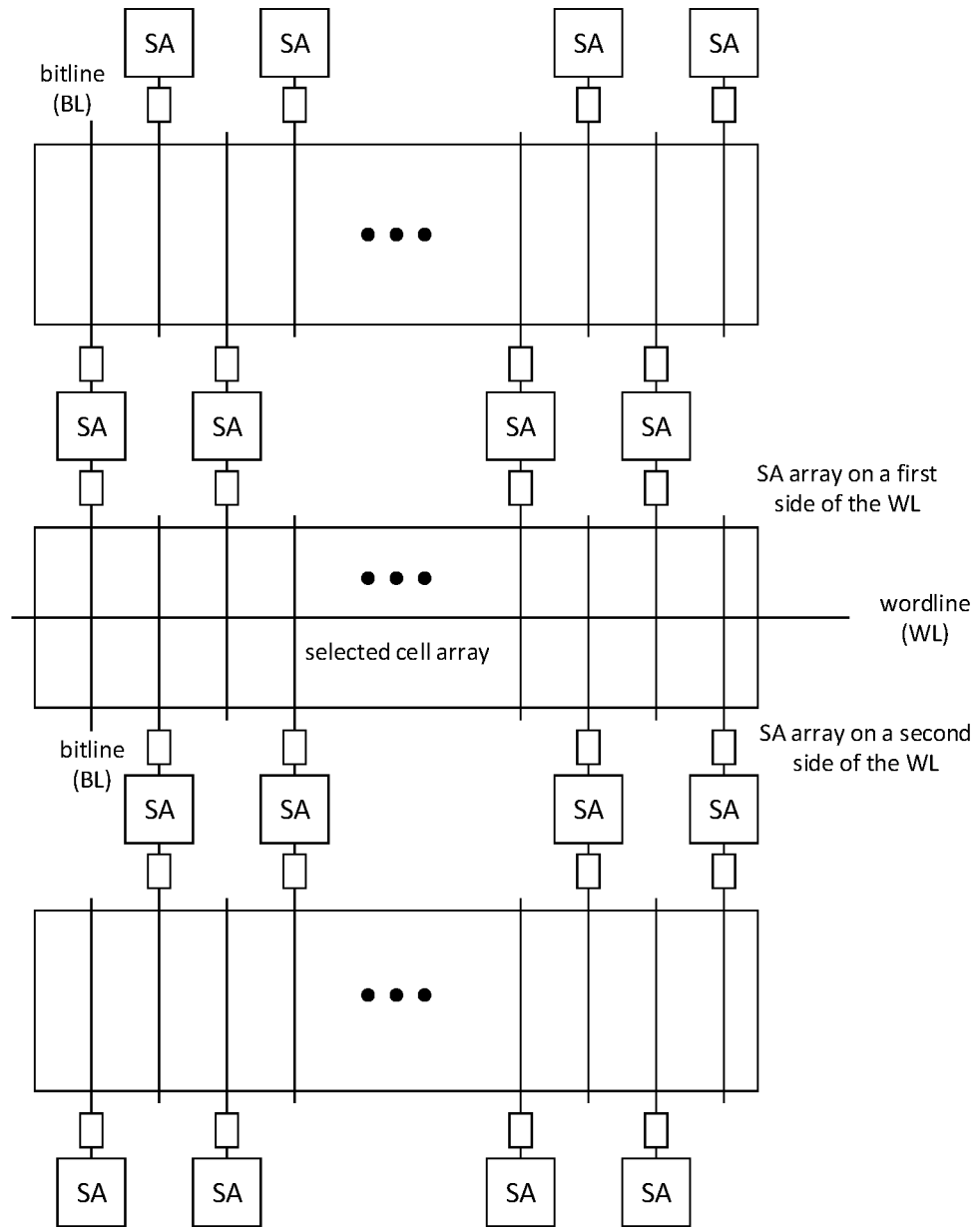

FIG. 3 shows a diagram illustrating a memory device in accordance with one embodiment of this invention.

Figure 4:
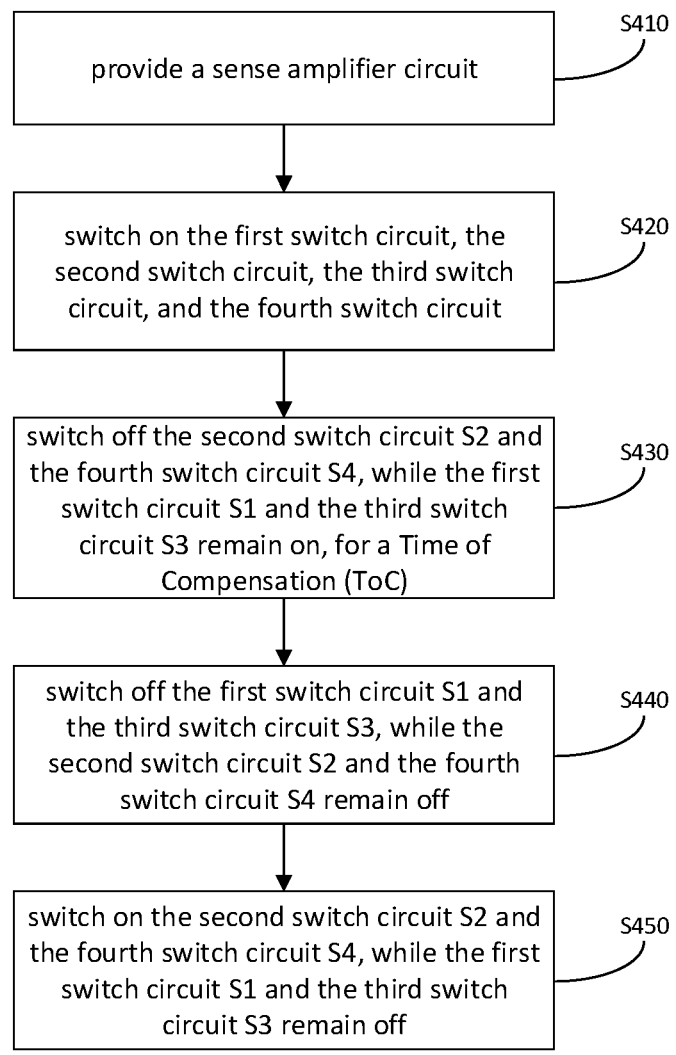

FIG. 4 shows a flowchart illustrating a method for compensating an input-referred offset voltage of a sense amplifier circuit in accordance with one embodiment of this invention.

Figure 5A:
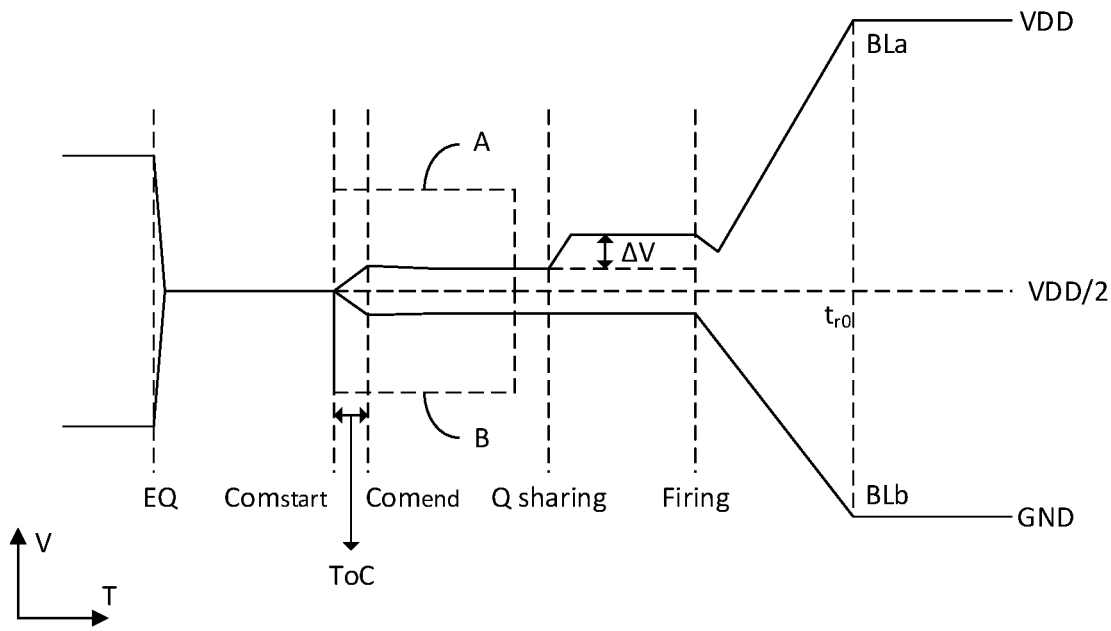
Figure 5B:
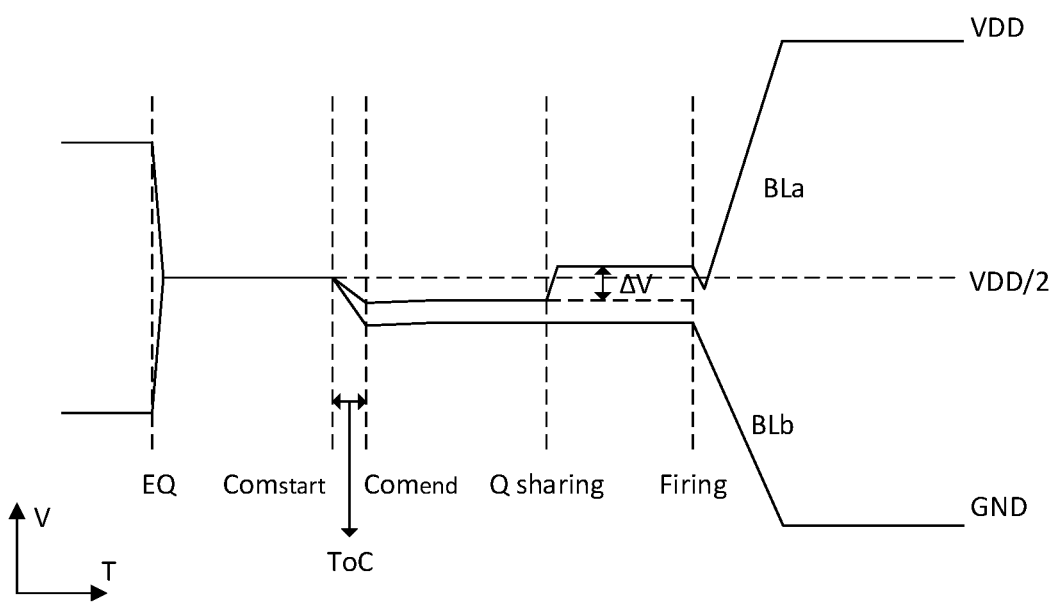

FIGS. 5A and 5B show diagrams illustrating waveforms of the voltages on a first bitline and a second bitline of a sense amplifier circuit in accordance with one or more embodiments of this invention.

Figure 6A:
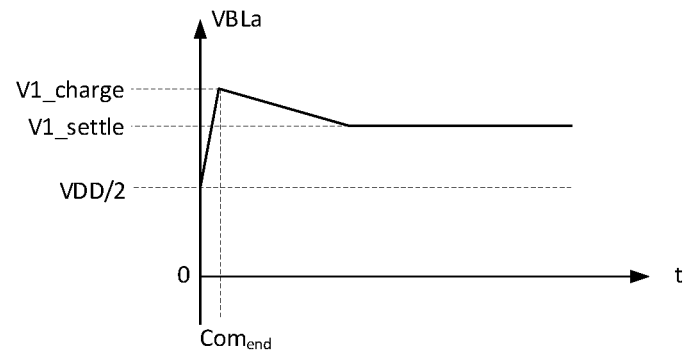
Figure 6B:
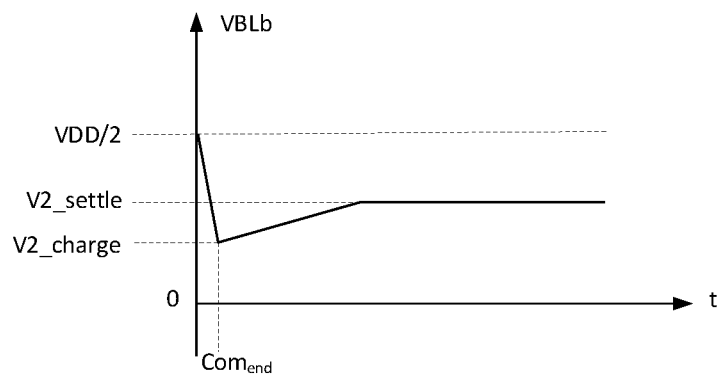

FIGS. 6A and 6B show enlarged diagrams of region A and region B of FIG. 5A, respectively.

Figure 6C:
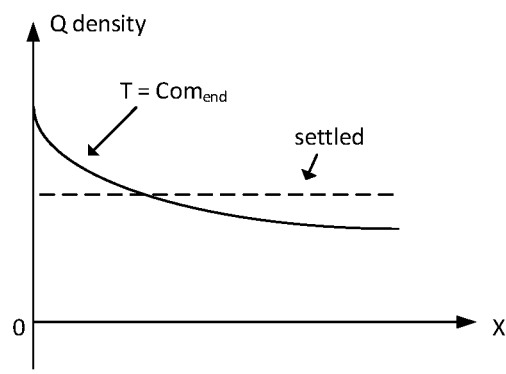
Figure 6D:
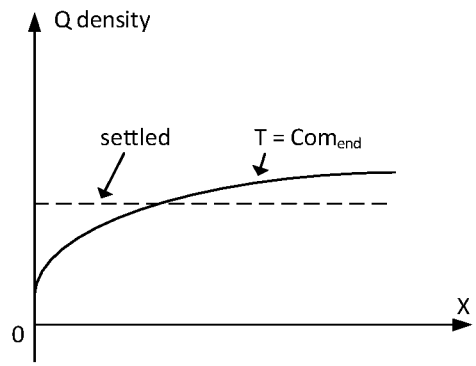

FIGS. 6C and 6D show diagrams illustrating distributions of the charge densities on a first bitline and a second bitline of a sense amplifier circuit in accordance with one or more embodiments of this invention.

Figure 7A:
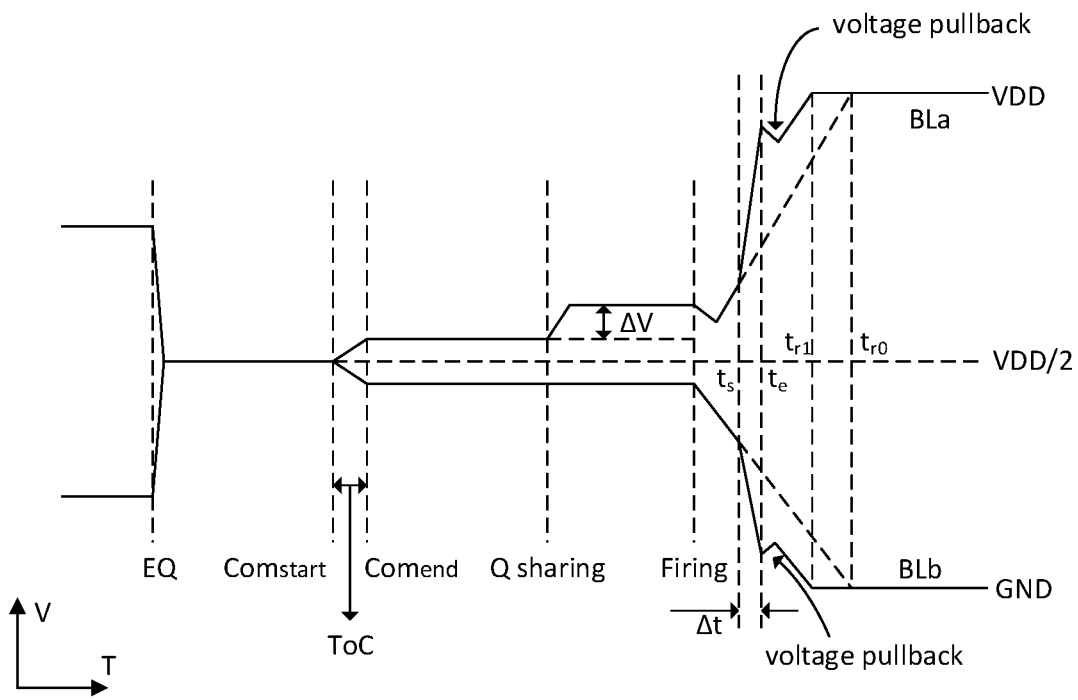
Figure 7B:
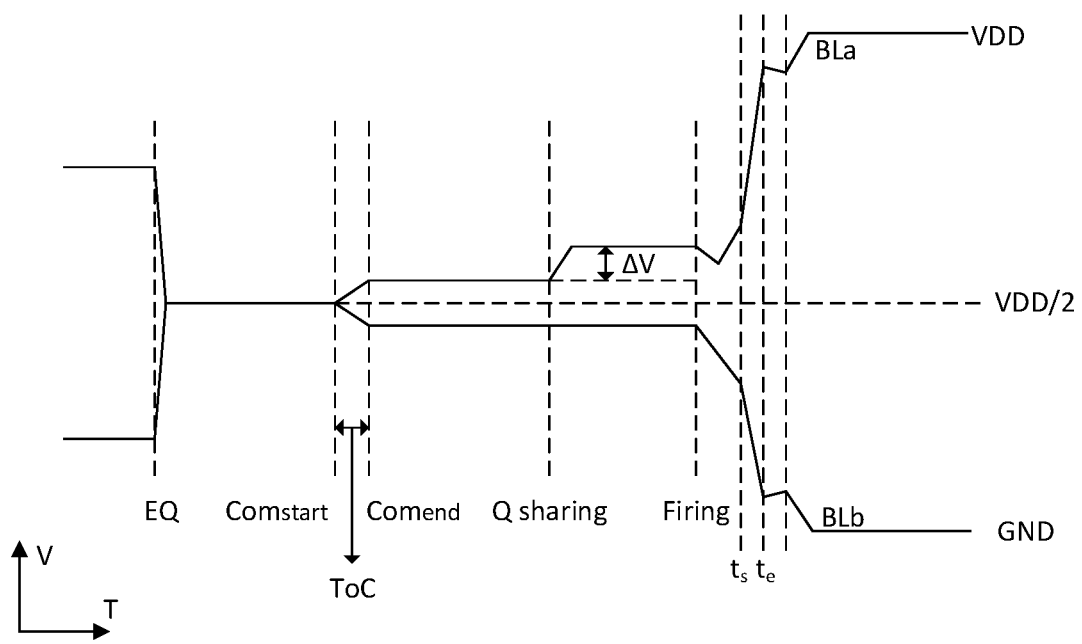

FIGS. 7A and 7B show diagrams illustrating waveforms of the voltages on a first bitline and a second bitline of sense amplifier circuit in accordance with one or more embodiments of this invention.

Figure 8:
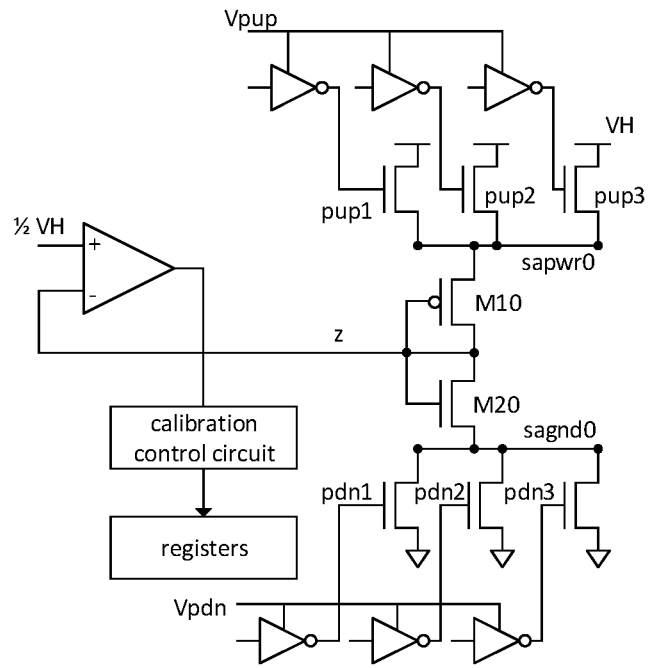

FIG. 8 shows a diagram illustrating a calibration circuit in accordance with one embodiment of this invention.

Figure 9:
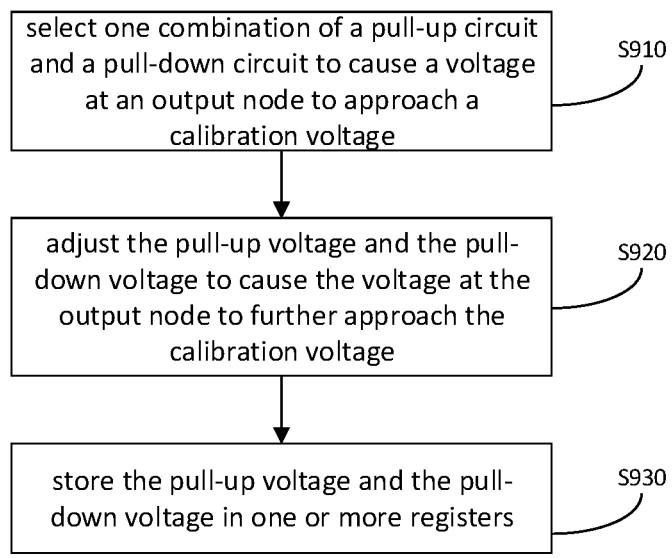

FIG. 9 shows a flowchart illustrating a calibration process in accordance with one embodiment of this invention.

Figure 10A:
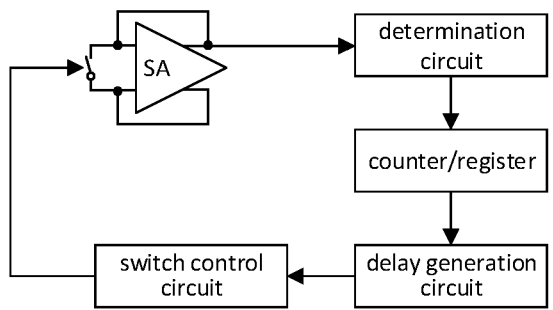

FIG. 10A shows a diagram illustrating a circuit to determine the time of compensation in accordance with one embodiment of this invention.

Figure 10B:
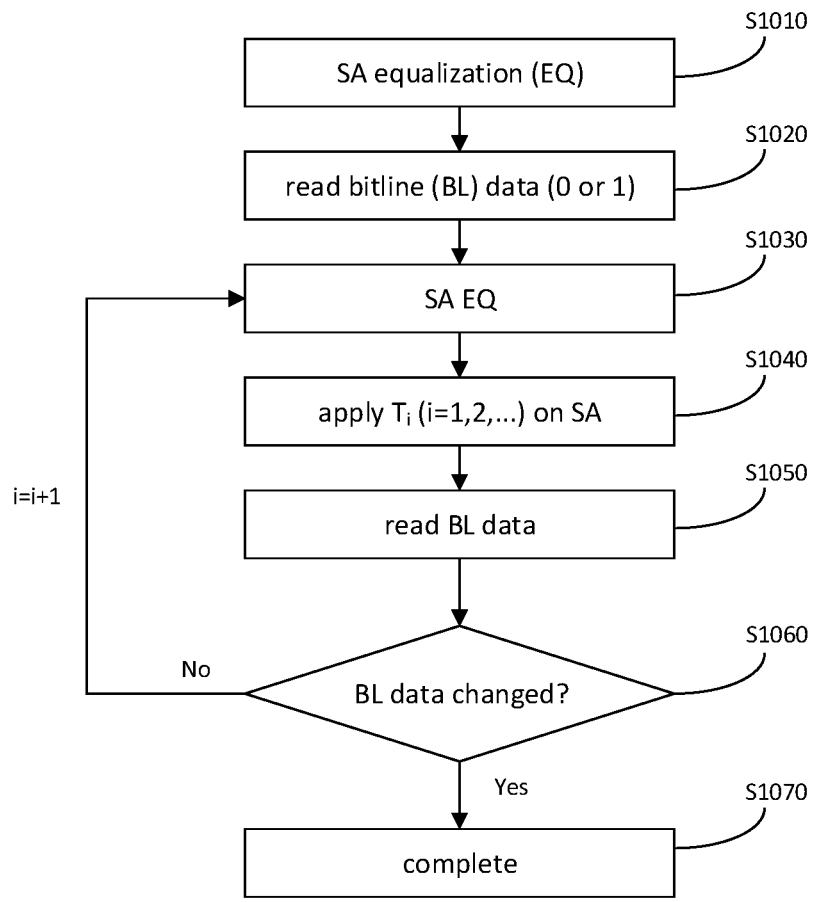

FIG. 10B shows a flowchart illustrating a method to determine the time of compensation in accordance with one embodiment of this invention.

Figure 11:
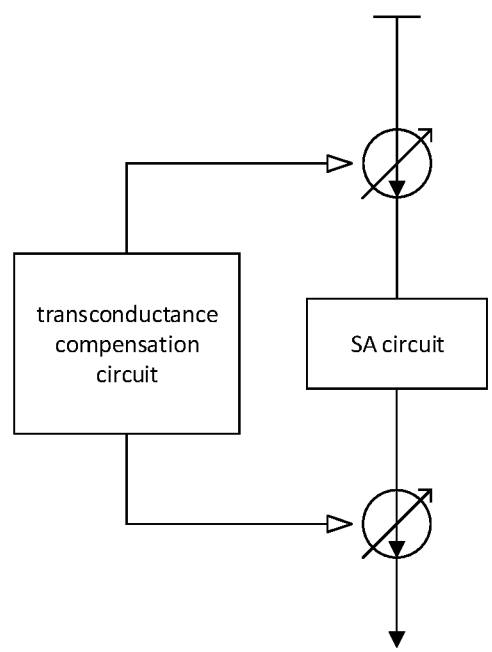

FIG. 11 shows a diagram illustrating a sense amplifier circuit including a transconductance compensation circuit in accordance with one embodiment of this invention.

Figure 12A:
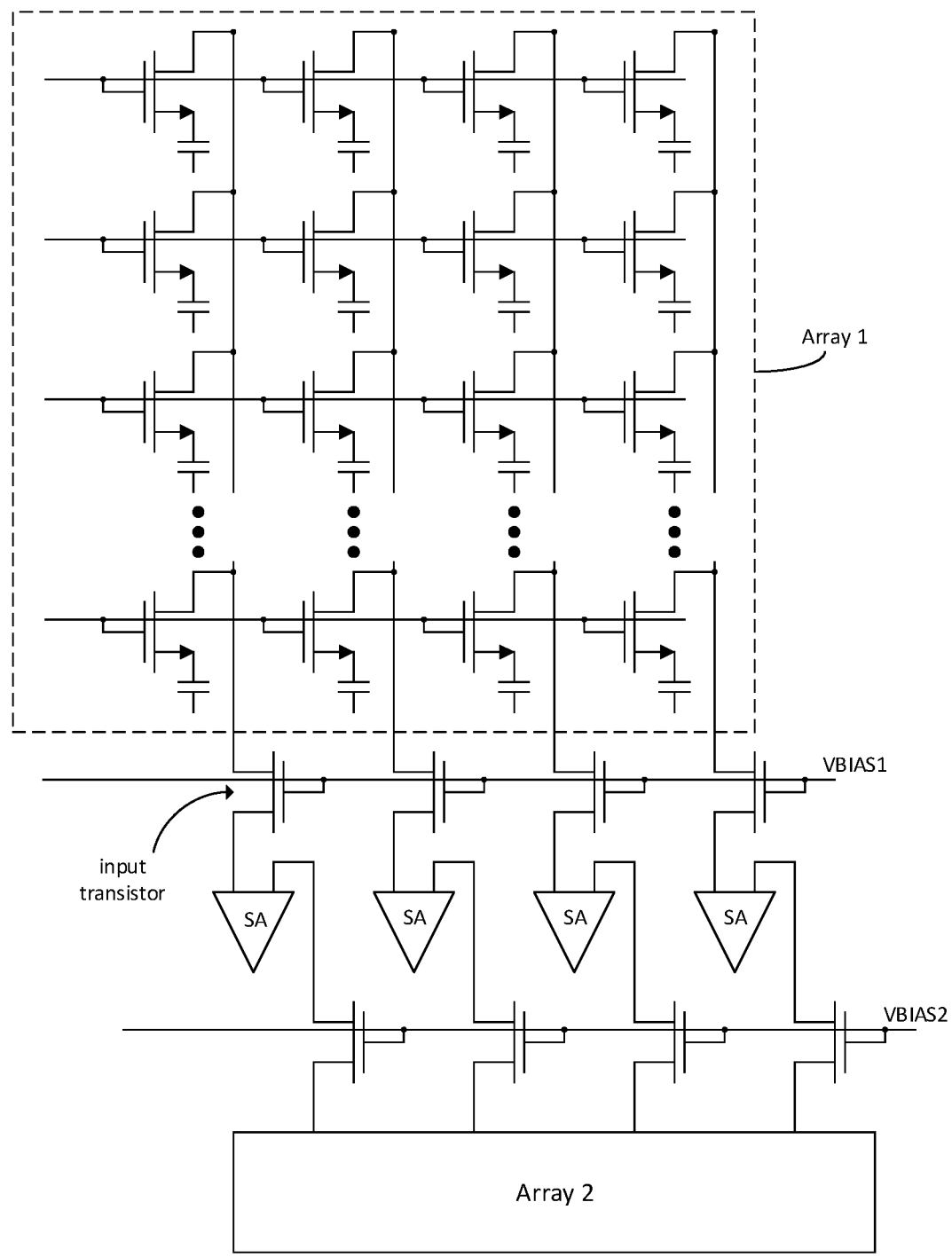
Figure 12B:
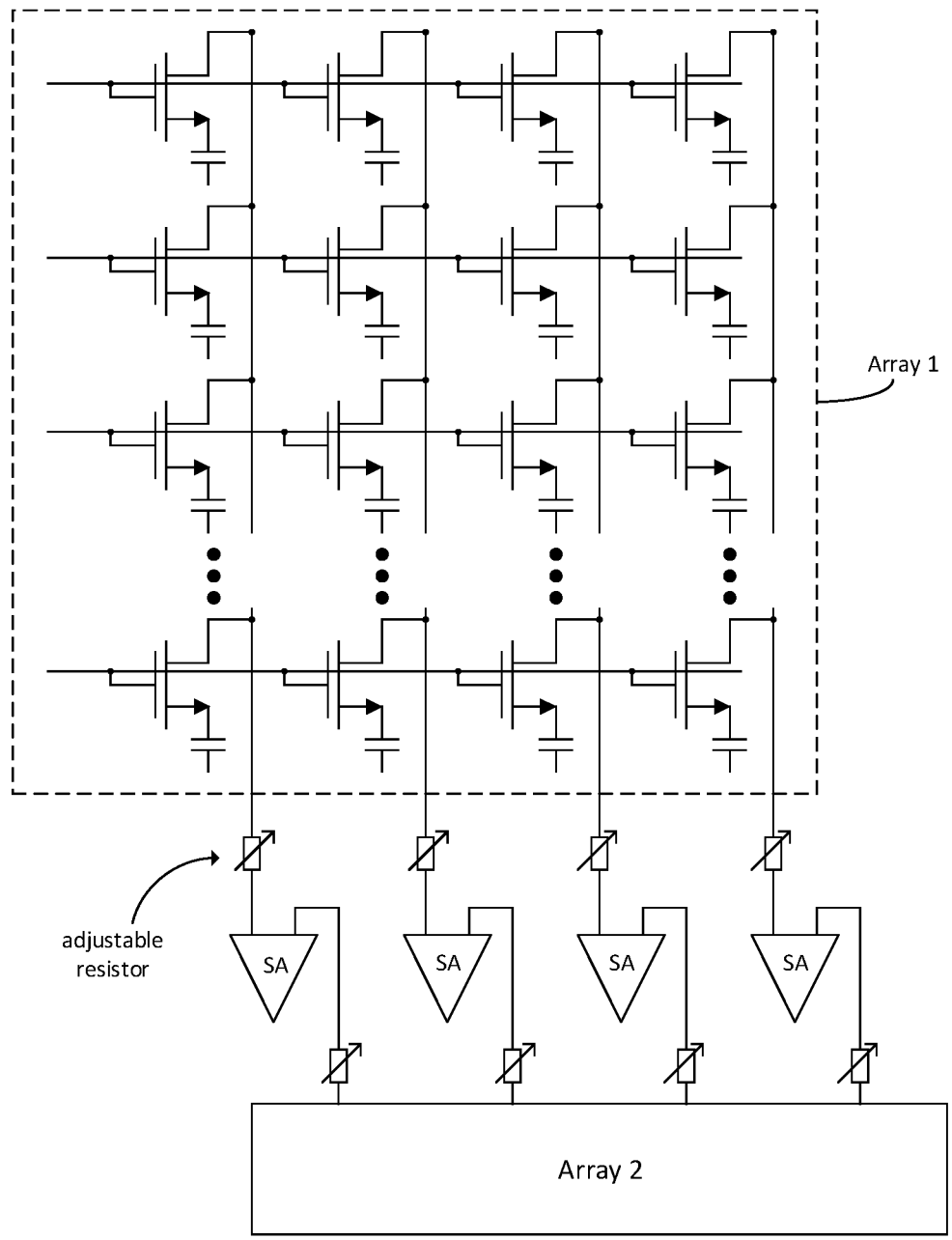

FIGS. 12A and 12B show diagrams illustrating a memory device including circuits for compensating bitline resistance in accordance with one or more embodiments of this invention.

Figure 13:
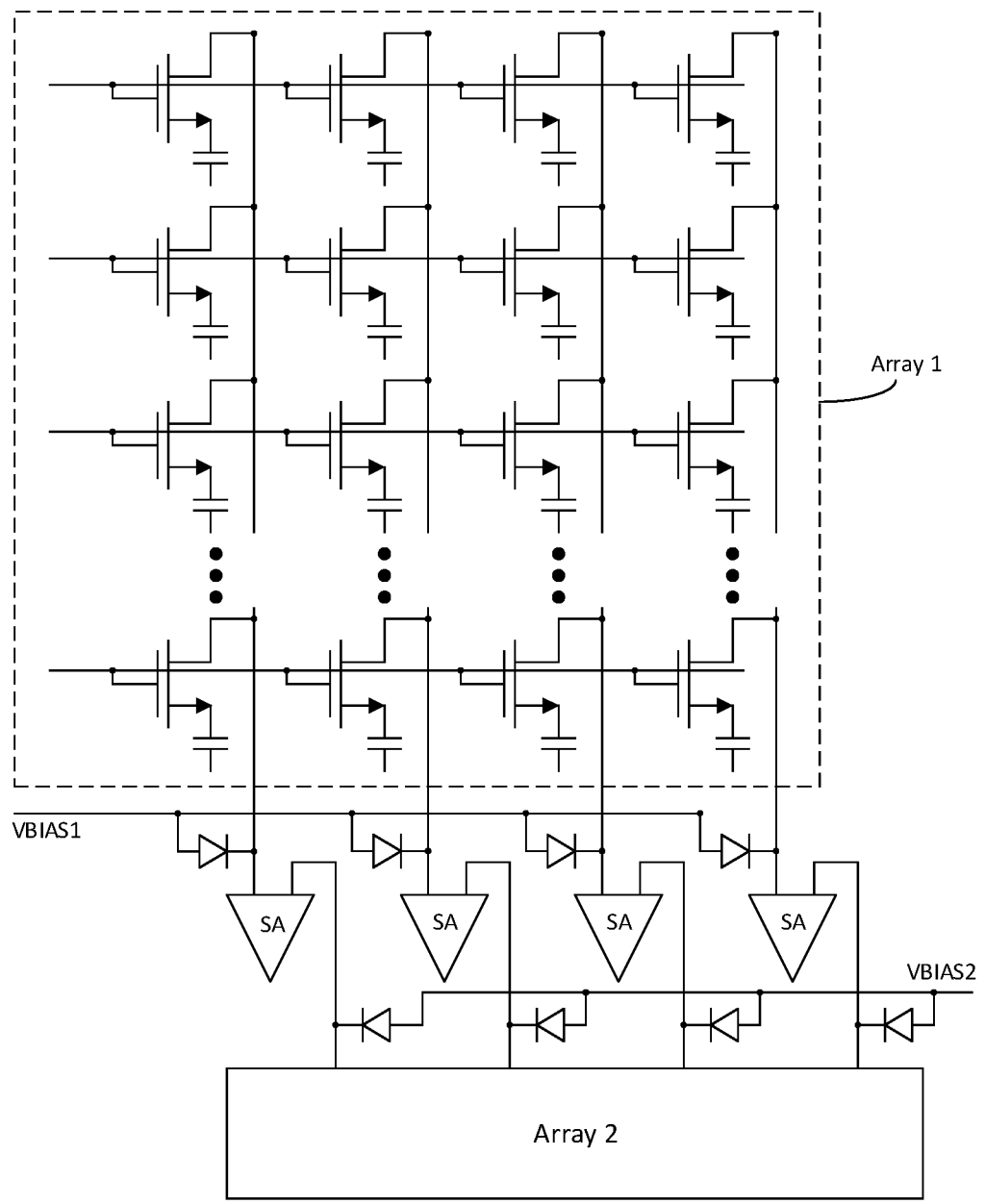

FIG. 13 shows a diagram illustrating a memory device including circuits for compensating bitline parasitic capacitor in accordance with one embodiment of this invention.

DETAILED DESCRIPTION OF THE EMBODIMENTS

Exemplary embodiments will now be described more fully with reference to the accompanying drawings. However, these exemplary embodiments can be implemented in many forms and should not be construed as being limited to those set forth herein. Rather, these embodiments are presented to provide a full and thorough understanding of this invention and to fully convey the concepts of the exemplary embodiments to others skilled in the art. In addition, the described features, structures, and characteristics may be combined in any suitable manner in one or more embodiments. In the following detailed description, many specific details are set forth to provide a more thorough understanding of this invention. However, those skilled in the art will recognize that the various embodiments can be practiced without one or more of the specific details or with other methods, components, materials, or the like. In some instances, well-known structures, materials, or operations are not shown or not described in detail to avoid obscuring aspects of the embodiments.

Further, the drawings are merely illustrative of this invention and are not necessarily drawn to scale. Throughout the drawing, like reference numbers indicate identical or similar elements, so any duplicate description of them will be omitted. The represented blocks in the drawing are purely functional entities, which do not necessarily correspond to physically separated entities. In other words, these functional entities may be implemented as software, or entirely or in part in one or more software-hardened modules, or in different networks and/or processor devices and/or microcontroller devices.

The flowcharts represented in the drawings are merely illustrative and do not necessarily include all shown steps. For example, some of these steps may be divided, while some can be at least partially combined. Therefore, the actual order in which they are performed may vary depending on the actual conditions.

1. Sense Amplifier Circuit

FIG. 1A shows a conventional sense amplifier circuit. As shown in FIG. 1A, a conventional sense amplifier circuit may include a first inverter and a second inverter. The first inverter may include a first transistor M1 and a second transistor M2 connected together, and the second inverter may include a third transistor M3 and a fourth transistor M4 connected together. An input (node i1) of the first inverter may be connected to an output (node o2) of the second inverter, and an input (node i2) of the second inverter may be connected to an output (node o1) of the first inverter. That is, the first inverter and the second inverter may be cross-coupled with each other. The sense amplifier circuit may further include a pull-up circuit for providing a pull-up voltage, and a pull-down circuit for providing a pull-down voltage. When reading data from a memory cell, one of a bitline $S_x$ and a bitline $S_y$ may work as an input of the sense amplifier circuit and contain charges from the corresponding memory cell, while the other serving as a reference for the sensing operation.

As shown in FIG. 1A, a sense amplifier circuit may have two bitlines each connected with one or more memory cells. An input signal to a sense amplifier circuit may be received through one of the two bitlines, while the other bitline serving as a reference. While not reading data from a memory cell of the memory device, memory cells are electrically isolated from the sense amplifier circuit, thus no input signal is provided to a sense amplifier circuit. When one memory cell is selected for reading data, a transistor connected between the memory cell and the sense amplifier circuit becomes conductive, causing the storage capacitor associated with that memory cell be connected to a bitline of the sense amplifier circuit. Then the electric charge stored in the capacitor may generate an input signal (i.e., a voltage difference) on the bitlines. When amplifying the input signal, a high voltage may be applied on a voltage node, and a low voltage may be applied on a ground node of the sense amplifier circuit, and the input signal on the bitlines may be amplified. The amplified signal then may be sent to an external device through the bitlines to read the data of the memory cell.

A sense amplifier circuit, however, may have an offset voltage that may affect the sensitivity of the circuit. The offset voltage may be caused by various factors, including but not limited to, deviation between threshold voltages of corresponding transistors in the cross-coupled inverters, mismatch between series resistance on source/drain nodes of the transistors, mismatch between structural sizes of the corresponding circuit components, carrier mobility mismatch, substrate bias, mismatch on conductance coefficients, and mismatch on node capacitances of corresponding transistors. In one example, the offset voltage may be caused by the difference between threshold voltages of corresponding transistors in two inverting amplifiers in the sense amplifier circuit. For example, due to the variation in the manufacturing process, the threshold voltage of a transistor in one inverter may be higher than the threshold voltage of a corresponding transistor in a coupling inverter in the sense amplifier circuit. As a result, an input signal to the sense amplifier circuit must be larger than a minimum voltage margin, which is determined by the offset voltage, for data in an associated memory cell to be properly read. In other words, the offset voltage reduces the sensitivity of the sense amplifier circuit. In this application, for the ease of description, all of the above-mentioned variations and mismatches are collectively referred to as the "mismatch" in the sense amplifier circuit.

The impact of the offset voltage to a sense amplifier circuit is further described with reference to FIGS. 1B and 1C. The presence of mismatches in the sense amplifier circuit may produce DC output voltages that are indistinguishable from the DC component of the signal being amplified. A sense amplifier containing mismatches, as shown in FIG. 1B, may be equivalently represented by an ideal mismatch-free sense amplifier with an input-referred voltage source $V_{os}$ (i.e., providing an input-referred offset voltage) and an input-referred current source $I_{os}$ (providing an input-referred offset current), as shown in FIG. 1C. In this application, the term "input-referred offset voltage" is used to represent the offset voltage of a sense amplifier containing mismatches.

The methods and devices that compensate a sense amplifier circuit from a voltage compensation perspective (i.e., compensating the input-referred offset voltage) are disclosed in this application. This invention, however, is not limited in this regard. Based on the same inventive concept disclosed herein, methods and devices that compensate a sense amplifier circuit from a current compensation perspective (i.e., compensating the input-referred offset current) are contemplated, and these methods and devices are within the protection scope of this application.

This application first presents a sense amplifier circuit that compensates an input-referred offset voltage therein. FIG. 2A shows a sense amplifier circuit in accordance with one embodiment of this invention. This sense amplifier circuit will be described in details below with reference to FIG. 2A.

As shown in FIG. 2A, the sense amplifier circuit may include an amplification circuit for amplifying a voltage signal. The amplification circuit may include a first inverting amplifier connected to a first bitline BLa and a second inverting amplifier connected to a second bitline BLb. The amplification circuit may be configured to amplify a signal (e.g., a voltage signal) applied between the first bitline BLa and the second bitline BLb.

More specifically, the amplification circuit may include the first inverting amplifier INV1 (dashed box INV1 in FIG. 2A) and the second inverting amplifier INV2 (dashed box INV2 in FIG. 2A). The first inverting amplifier INV1 may be connected to a first bitline BLa, and the second inverting amplifier INV2 may be connected to a second bitline BLb. An input of the first inverting amplifier INV1 may be connected to an output of the second inverting amplifier INV2 at a first node a, and an input of the second inverting amplifier INV2 may be connected to an output of the first inverting amplifier INV1 at a second node b. That is, the first inverting amplifier INV1 and the second inverting amplifier INV2 may be cross-coupled with each other. The first inverting amplifier INV1 and the second inverting amplifier INV2 may be both connected to a voltage node sapwr, and both connected a ground node sagnd.

In some embodiments, as shown in FIG. 2A, the sense amplifier circuit may further include a compensation circuit coupled to the amplification circuit and configured to compensate an input-referred offset voltage of the amplification circuit. The input-referred offset voltage of the amplification circuit may be caused by the mismatches in the amplification circuit. In some embodiments, the input-referred offset voltage may reflect a difference in threshold voltages of corresponding transistors in the first inverting amplifier INV1 and the second inverting amplifier INV2. The compensation circuit may be configured to compensate the input-referred offset voltage of the amplification circuit by conducting charge injections to the first bitline BLa and the second bitline BLb.

In some embodiments, conducting charge injections to the first bitline BLa and the second bitline BLb may include: injecting a first charge generated by the first inverting amplifier INV1 to the second bitline BLb; and injecting a second charge generated by the second inverting amplifier INV2 to the first bitline BLa. The first charge and the second charge may generate a compensation voltage between the first bitline BLa and the second bitline BLb after a distribution of the first charge and the second charge on the bitlines settled. In this application, an electrical charge is "settled" on a bitline means the electrical charge has been fully propagated on the bitline, and details of this concept will be explained in greater details with reference to accompanying drawings in a later part of this application. The compensation voltage may be substantially equal to the input-referred offset voltage of the amplification circuit. In this application, a first voltage is "substantially equal" to a second voltage means the first voltage is within a certain range of the second voltage. The range may be, for example, ±10% or ±5% of the second voltage, and this invention is not limited in this regard. In one example, the compensation voltage generated by the first charge and the second charge may be within ±5% of the input-referred offset voltage of the sense amplifier circuit.

The first charge and the second charge may have same of different charge amounts, and same or different charge polarities. This invention is not limited in these regards.

In some embodiments, conducting charge injections to the first bitline BLa and the second bitline BLa may include: only injection the first charge generated by the first inverting amplifier INV1 to the second bitline BLb, or only injection the second charge generated by the second inverting amplifier INV2 to the first bitline BLa. In these scenarios, the first charge or the second charge may generate a compensation voltage between the first bitline BLa and the second bitline BLB after a distribution of the first charge or the second charge on the bitlines settled, and the compensation voltage may be substantially equal to the input-referred offset voltage of the amplification circuit.

The compensation circuit may include one or more capacitive elements. The capacitive elements may be elements that are capable of storage electrical charges, and may include, but not limited to, capacitors, diodes, fie-effect transistor (FET), metal-oxide-semiconductor field-effect transistor (MOSFET) that are capable of storing electrical charges. In one example, the one or more capacitive element may include a Ni capacitor or a bitline parasitic capacitor.

In some embodiments, as shown in FIG. 2A, the compensation circuit may include a first switch circuit S1, a second switch circuit S2, a third switch circuit S3, and a fourth switch circuit S4. A first end of the first switch circuit S1 may be connected to a first end of the second switch circuit at the first bitline BLa, and a first end of the third switch circuit S3 may be connected to a first end of the fourth switch circuit S4 at the second bitline BLb. A second end of the first switch circuit S1 may be connected to a second end of the fourth switch circuit S4 at the first node a, and a second end of the second switch circuit S2 may be connected to a second end of the third switch circuit S3 at the second node b.

In some embodiments, each of the first switch circuit S1, the second switch circuit S2, the third switch circuit S3, and the fourth switch circuit S4 may be a switch and may be in one of "ON" or "OFF" statuses. This invention, however, is not limited herein. Other suitable circuits that can provide an on/off switch function may be used as the switch circuit.

In some embodiments, each of the first switch circuit S1, the second switch circuit S2, the third switch circuit S3, and the fourth switch circuit S4 may be implemented using one or more transistors. For example, each of the switch circuits may comprise an N-type metal-oxide-semiconductor (NMOS) transistor, a P-type metal-oxide-semiconductor (PMOS) transistor, or a transmission gate. In that cases, other than an "ON" or "OFF" status, the switch circuit may also be in an intermediate conductive status depending on the conductive status of the transistors. A conductive state of each of these switch circuits may be controlled by applying a voltage on the corresponding transistors, such as on a gate terminal of corresponding NMOS transistor, PMOS transistor, or transmission gate.

Additionally, in some embodiments, the sense amplifier circuit may further include a switch control circuit (not shown in the drawings) coupled to the first switch circuit S1, the second switch circuit S2, the third switch circuit S3, and the fourth switch circuit S4. The switch control circuit may be configured to control a conductive status of each of these switch circuits. In one example, the switch control circuit may control a conductive status of each of these switch circuits by applying a voltage on a gate terminal of a corresponding transistor in each of the switch circuits.

Referring to FIG. 2A, in some embodiments, the first inverting amplifier INV1 may comprise a first transistor M1 and a second transistor M2. Each of the first transistor M1 and the second transistor M2 may have a first terminal, a second terminal, and a gate terminal. The second terminal of the first transistor M1 and the first terminal of the second transistor M2 may both be connected to the second node b. The gate terminal of the first transistor M1 and the gate terminal of the second transistor M2 may both be connected to the first node a.

The second inverting amplifier may comprise a third transistor M3 and a fourth transistor M4. Each of the third transistor M3 and the fourth transistor M4 may have a first terminal, a second terminal, and a gate terminal. The second terminal of the third transistor M3 and the first terminal of the fourth transistor M4 may both be connected to the first node a. The gate terminal of the third transistor M3 and the gate terminal of the fourth transistor M4 may both be connected to the second node b. The first terminal of the first transistor M1 and the first terminal of the third transistor may be connected to the voltage node sapwr, and the second terminal of the second transistor M2 and the second terminal of the fourth transistor M4 may be connected to the ground node sagnd.

In some embodiments, the first transistor M1 and the third transistor M3 may each have a first conductivity type, and the second transistor M2 and the fourth transistor M4 may each have a second conductivity type opposing the first conductivity type. For example, the first transistor M1 and the third transistor M3 may be P-type transistors, and the second transistor M2 and the fourth transistor M4 may be N-type transistors.

Referring to FIG. 2A, in some embodiments, the sense amplifier circuit may be provided with a plurality of pull-up circuits of different voltage pull-up capabilities, and be provided with a plurality of pull-down circuits of different voltage pull-down capabilities. One or more of the plurality of pull-up circuits may be selected to be coupled to the voltage node sapwr, and a pull-up voltage may be provided to the sense amplifier circuit through the selected one or more pull-up circuits. One or more of the plurality of pull-down circuits may be selected to be coupled to the ground node sagnd, and a pull-down voltage may be provided to the sense amplifier circuit through the selected one or more pull-down circuits.

In the aforementioned embodiments, the first inverting amplifier INV1 and the second inverting amplifier INV2 may each comprise two transistors. The first inverting amplifier INV1 and the second inverting amplifier INV2, however, may also be implemented by other suitable circuits, provided that the circuits can provide an inversion function. For example, the first inverting amplifier INV1 and the second inverting amplifier INV2 may each include three or more transistors. Detailed composition of the first inverting amplifier INV1 and the second inverting amplifier INV2 are not limited in this invention.

In the sense amplifier circuit in accordance with some embodiments of this invention, the first switch circuit S1 and the second switch circuit S2 may be connected with the first bitline BLa, and the third switch circuit S3 and the fourth switch circuit S4 may be connected with the second bitline BLb. By controlling each of the switch circuits to be on "ON" or "OFF" status, the first bitline BLa and the second bitline BLb may be connected to different internal components (e.g., inverting amplifiers) of the sense amplifier circuit.

In some embodiments, conducting charge injections to first bitline BLa and the second bitline BLb may include: conducting charge injections to the first bitline BLa and the second bitline BLb by operating the first, the second, the third, and the fourth switch circuits. The first charge and the second charge may, after settled on the bitlines, generate a compensation voltage between the first bitline BLa and the second bitline BLb to compensation the input-referred offset voltage in the amplification circuit, so that the performance of the associated memory device may be improved.

Based on the aforementioned sense amplifier circuit, this invention further provides a memory device. FIG. 3 shows a diagram illustrating a memory device in accordance with one embodiment of this invention. As shown in FIG. 3, the memory device may include a plurality of memory cells (not shown in FIG. 3) and a plurality of sense amplifier circuits. Each of the sense amplifier circuits may be the sense amplifier circuit in any of the aforementioned embodiments. Relevant part in the aforementioned embodiments for the sense amplifier circuit may be referred to for detail composition of the sense amplifier circuit, which will not be repeatedly described herein for the sake of conciseness. For each of the plurality of sense amplifier circuits, each of the first bitline and the second bitline may be connected with one of the plurality of memory cells. When reading the data from the memory device, the data stored in a memory cell can be amplified by a corresponding sense amplifier circuit connected therein. The plurality of memory cells may be connected through a wordline (WL).

In some embodiments, the plurality of sense amplifier circuits may be alternately arranged on a first side of the wordline and a second side of the wordline opposing the first side. Each of the sense amplifier circuits arranged on the first side of the wordline may be connected to one of the plurality of memory cells through the first bitline, and each of the sense amplifier circuits arranged on the second side of the wordline may be connected to one of the plurality of memory cells through the second bitline.

2. Operation Methods of the Sense Amplifier Circuits

Based on the aforementioned sense amplifier circuits, this invention further presents operation methods of the sense amplifier circuits, which compensate the input-referred offset voltage of the amplification circuits.

2.1 Compensate Input-Referred Offset Voltage in the Amplification Circuit

FIGS. 2A, 2B, and 2C show diagrams illustrating different stages of a sense amplifier circuit operation method in accordance with some embodiments of this invention. FIG. 4 shows a flowchart illustrating a sense amplifier circuit operation method in accordance with one embodiment of this invention. This method will be described below in details with reference to these drawings.

In one example, the sense amplifier circuit operation method may be performed on a sense amplifier circuit shown in FIG. 2A. That is, the sense amplifier circuit may include an amplification circuit for amplifying a voltage signal and a compensation circuit for compensating an input-referred offset voltage of the amplification circuit. The amplification circuit may include a first inverting amplifier INV1 and a second inverting amplifier INV2. The compensation circuit may include a first switch circuit S1, a second switch circuit S2, a third switch circuit S3, and a fourth switch circuit S4. The sense amplifier circuit may have a first bitline BLa and a second bitline BLb.

The sense amplifier circuit operation method may include generating, by operating the first, the second, the third, and the fourth switch circuits, a compensation voltage between the first bitline BLa and the second bitline BLb to compensate the input-referred offset voltage of the amplification circuit.

More specifically, referring to FIG. 4, the sense amplifier circuit operation method may include the following steps S410 through S450.

In step S410, a sense amplifier circuit may be provided. The sense amplifier circuit may be a sense amplifier circuit in any of the aforementioned embodiments. Relevant parts in the aforementioned embodiments may be referred to for detail composition of the sense amplifier circuit, which will not be repeatedly described herein for the sake of conciseness.

In step S420, the first switch circuit S1, the second switch circuit S2, the third switch circuit S3, and the fourth switch circuit S4 may all be switched on, as shown in FIG. 2A. This step may be referred to as an equalization (EQ) step. In this step, since all the four switch circuits are switched on, the first bitline BLa is connected to both the first node a and the second node b, and the second bitline BLb is connected to both the first node a and the second node b. The fourth switch circuits may remain on for sufficiently long time to ensure that voltages on the first bitline BLa, the second bitline BLb, the first node a, and the second node b converge to one voltage level. In this step, the voltage node sapwr may be provided an initial up voltage, and the ground node sagnd may be provided an initial down voltage.

In step S430, the second switch circuit S2 and the fourth switch circuit S4 may be switched off, while the first switch circuit S1 and the third switch circuit S3 remain on, as shown in FIG. 2B. In this step, the voltage node sapwr may be provided a pull-up voltage higher than the initial up voltage, and ground node sagnd may be provided a pull-down voltage lower than the initial down voltage. Thus the sense amplifier circuit may work as an amplifier. Since in previous step (i.e., step S420), voltages on the first bitline BLa, the second bitline BLb, the first node a, and the second node b have been converged to one voltage level, the first bitline BLa and the second bitline BLb do not have any external input. Thus a voltage difference between the first bitline BLa and the second bitline BLb may reflect an input-referred offset voltage in the amplification circuit (e.g., a difference between threshold voltages of corresponding transistors in the first inverting amplifier INV1 and the second inverting amplifier INV2). In this step, the first inverting amplifier INV1 and the second inverting amplifier INV2 may be cross-coupled with each other.

The first switch circuit S1 and the third switch circuit S3 may remain on for a Time of compensation (Toc). By choosing a proper Toc, the voltage difference between the first bitline BLa and the second bitline BLb at the end of the Toc, referred to as a compensation voltage, may reach a desired voltage level. In some embodiments, the desired voltage level may be a voltage level that reflects an input-referred offset voltage of the amplification circuit. In some embodiments, the input-referred offset voltage of the amplification circuit may be the difference between threshold voltages of corresponding transistors in the first inverting amplifier INV1 and the second inverting amplifier INV2, and the compensation voltage may reflect the difference between the threshold voltages. For example, the compensation voltage may be substantially equal to the input-referred offset voltage. The desired voltage level, however, may be any other value depending on specific needs, and this invention is not limited in this regard.

The aforementioned step S430 may also be understood as a charging process, in which the compensation circuit conducts a charging operation to inject charges to at least one of the first bitline BLa and the second bitline BLb. Upon the completion of the charging operation, the charges injected to the first bitline BLa and/or the second bitline BLb may settled on the bitlines, and voltage difference between near-ends of the first bitline BLa and the second bitline BLb may decrease during this process. Therefore, to sufficiently compensate the input-referred offset voltage, the voltage difference between near-ends of the first bitline BLa and the second bitline BLb may be larger than the input-referred offset voltage of the amplification circuit at the end of the charging operation. For example, the voltage difference may be 10%-40% larger than the input-referred offset voltage at the end of the charging operation. Thus, after the charges injected to the first bitline BLa and the second bitline BLb settled on the bitlines, the resulted voltage difference at the near-ends of the bitlines may be substantially equal to the input-referred offset voltage.

Next, in step S440, the first switch circuit S1 and the third switch circuit S3 may be switched off, resulting in all the four switch circuits being switched off. Thus the compensation voltage may be retained at the first bitline BLa and the second bitline BLb. In this step, the voltage at the voltage node sapwr may be returned to the initial up voltage, and the voltage at the ground node sagnd may be returned to the initial down voltage.

Next, in step S450, the second switch circuit S2 and the fourth switch circuit S4 may be switched on, while the first switch circuit S1 and the third switch circuit S3 remain off, as shown in FIG. 2C. In this step, the voltage node sapwr may be provided a pull-up voltage, the ground node sagnd may be provided a pull-down voltage, and the sense amplifier circuit may amplify an input signal between the first bitline BLa and the second bitline BLb.

FIGS. 5A and 5B show diagrams illustrating waveforms of the voltage on the first bitline BLa and the voltage on the second bitline BLb of a sense amplifier circuit in accordance with one or more embodiments of this invention. The sense amplifier circuit operation method will be further described below with reference to these drawings to fully appreciate the compensation capability of this sense amplifier circuit.

Referring to FIGS. 4 and 5A, in step S420, corresponding to time EQ in FIG. 5A, the first switch circuit S1, the second switch circuit S2, the third switch circuit S3, and the fourth switch circuit S4 are all switched on (as shown in FIG. 2A). The voltages on the first bitline BLa and the second bitline BLb may converge to one voltage.

In step S430, corresponding to time $Com_{start}$ in FIG. 5A, the second switch circuit S2 and the fourth switch circuit S4 are switched off, while the first switch circuit S1 and the third switch circuit S3 remain on (as shown in FIG. 2B). At this time, the voltage node sapwr may be provided a pull-up voltage, and the ground node sagnd may be provided a pull-down voltage, thus the sense amplifier may work as an amplifier and amplify a voltage difference (e.g., a difference between the threshold voltages of corresponding transistors in the inverting amplifiers). The voltage difference may be reflected as a difference on the voltages on the first bitline BLa and the second bitline BLb. The larger an input-referred offset voltage, the faster the voltages on the first bitline BLa and the second bitline BLb will diverge.

In step S430, the second switch circuit S2 and the fourth switch circuit S4 may remain off, and the first switch circuit S1 and the third switch circuit S3 may remain on for a duration of Toc. During this time, the voltage of the first bitline BLa and the voltage of the second bitline BLb continue to diverge, as shown in FIG. 5A, thereby amplifying the voltage difference in the sense amplifier circuit.

Next, in step S440, corresponding to time Com$_{end}$ in FIG. 5A, all the four switch circuits are switched off, and the voltage difference on the first bitline BLa and the second bitline BLb (the compensation voltage) may be retained. In some embodiments, the input-referred offset voltage of the amplification circuit may be a difference between the threshold voltage of corresponding transistors in the first inverting amplifier and the second inverting amplifier. By choosing a proper Toc, the compensation voltage may reflect the difference between the threshold voltages. For example, the compensation voltage may have a substantially same magnitude as the difference between the threshold voltages.

As shown in FIG. 5A, the compensation voltage may be maintained on the first bitline BLa and the second bitline BLb until a particular memory cell corresponding to the sense amplifier circuit is selected (corresponding to time Q sharing in FIG. 5A) for reading data thereon. Accessing a memory cell may result in charge sharing between the capacitor of the memory cell and a bitline capacitor. The charge sharing may cause the voltage on the bitline corresponding to the memory cell either to increase for a stored logic one or to decrease for a stored logic zero. When reading a memory cell, the voltage difference between two bitlines, i.e., signal voltage V$_{sig}$, may depend on a capacitor of the memory cell C$_{mbit}$, an equivalent capacitor of the bitline C$_{BL}$, and a voltage stored on the memory cell prior to the access V$_{cell}$, and can be expressed as:

$$V_{sig} = V_{cell} \frac{C_{mbit}}{C_{BL} + C_{mbit}}$$

In this case, as shown in FIG. 5A, when the memory cell is accessed (i.e., at time Q sharing), the voltage difference between the first bitline BLa and the second bitline BLb may begin to change and eventually may result in a voltage change of ΔV.

In step S450, the second switch circuit S2 and the fourth switch circuit S4 are switched on while the first switch circuit S1 and the third switch circuit S3 remain off (as shown in FIG. 2C). In this step, starting from time Firing in FIG. 5A, the voltage node sapwr may be provided a pull-up voltage, the ground node may be provided a pull-down voltage, and the sense amplifier circuit may amply the voltage different between the first bitline BLa and the second bitline BLb. The voltage difference provided to the sense amplifier circuit is the signal voltage V$_{sig}$ superimposed on the compensation voltage. Since the compensation voltage may reflect the input-referred offset voltage in the amplification circuit (e.g., the compensation voltage may have a substantially same magnitude of the input-referred offset voltage), the input-referred offset voltage of the sense amplifier circuit may be compensated.

FIG. 5B shows a diagram illustrating a waveform of the voltage on the first bitline BLa and the voltage on the second bitline BLb of a sense amplifier circuit in accordance with another embodiment of this invention. FIG. 5B is similar to FIG. 5A except that the sense amplifier circuit of FIG. 5B has a different mismatch than that of FIG. 5A. As a result, during the time of compensation (i.e., Toc), the voltage on the first bitline BLa and the voltage on the second bitline BLb may diverge differently than the corresponding voltages shown in FIG. 5A. As shown in FIGS. 5A and 5B, in the sense amplifier circuit operation method of this invention, the compensation voltage between the first bitline BLa and the second bitline BLb may reflect a specific input-referred offset voltage in the sense amplifier circuit, therefore by choose a proper Toc, the input-referred offset voltage in the sense amplifier circuit may be automatically compensated.

As shown in FIGS. 2A, 2B, and 2C, in the sense amplifier circuit operation methods of this invention, at least one of the first bitline BLa and the second bitline BLa may be connected, through the compensation circuit, to one of the outputs of the first inverting amplifier INV1 and the second inverting amplifier INV2 during the signal amplification stage. This at least one of the first bitline BLa and the second bitline BLb maybe connected to the other of the outputs of the first inverting amplifier INV1 and the second inverting amplifier INV2 during the offset compensation stage. That is, at least one of the first bitline BLa and the second bitline BLb will be connected to outputs of different inverting amplifiers during the signal amplification stage and the offset compensation stage. Additionally, during the offset compensation stage, the sense amplifier circuit works as an amplifier to amplify a voltage caused by the mismatches in the sense amplifier circuit, therefore a gain of the sense amplifier circuit is larger than one during the offset compensation stage. During the signal amplification stage, an output of the first inverting amplifier INV1 may be connected to the first bitline BLa, and an output of the second inverting amplifier INV2 may be connected to the second bitline BLb, while during the offset compensation stage, the output of the first inverting amplifier INV1 may be connected to the second bitline BLb, and the output of the second inverting amplifier INV2 may be connected to the first bitline BLa.

In the sense amplifier circuit operation method of this invention described above, all the four switch circuits are first switched on for a sufficiently long time to cause voltages on the first bitline BLa, the second bitline BLb, the first node a, and the second node b to converge to one voltage level. Then, the second switch circuit and the fourth switch circuit are switched off, while the first switch circuit and the third switch circuit remain on, for a duration of Toc. In this step, mismatches in the sense amplifier circuit (e.g., a difference in the threshold voltages of corresponding transistors) may result in a voltage difference (i.e., the compensation voltage) between the first bitline BLa and the second bitline BLb. By choosing a proper Toc, the compensation voltage may reflect the input-referred offset voltage of the amplification circuit (e.g., the compensation voltage may have a substantially same magnitude as the difference of the threshold voltages). Then the first switch circuit and the third switch circuit are switched off, to retain the compensation voltage on the first bitline BLa and the second bitline BLb. When the second switch circuit and the fourth switch circuit are subsequently switched on to amplify an input signal, the input signal is superimposed on the compensation voltage so that the input-referred offset voltage of the amplification circuit may be compensated. Thus, the performance of the associated memory device may be improved.

Inherent electrical characteristics of bitlines, such as bitline resistances $R_{BL}$ and bitline parasitic capacitance $C_{BL}$, may affect a voltage on a bitline. The sense amplifier circuit operation method of this invention takes into consideration these effects, and thus improves the accuracy of the input-referred offset voltage compensation. FIGS. 6A and 6B show enlarged diagrams of region A and region B of FIG. 5A, respectively. FIGS. 6C and 6D show diagrams illustrating distributions of charge densities on a first bitline and a second bitline of a sense amplifier circuit in accordance with one or more embodiments of this invention. The sense amplifier circuit operation method will be further described below with reference to these drawings.

Referring to FIG. 6A, after the Toc (i.e., $Com_{end}$), the voltage at the first bitline BLa (i.e., the voltage at the node of the first bitline BLa connected to the sense amplifier circuit) may begin to gradually decrease from a charge voltage to a settled voltage (i.e., from V1_charge to V1_settle) due to the propagation of charge along the first bitline BLa. The amount of voltage drop (i.e., V1_charge−V1_settle) may be determined by total charge injected to the first bitline BLa and electronic characteristics of the first bitline BLa (e.g., bitline parasitic capacitance $C_{BL}$). Correspondingly, FIG. 6C shows that immediately after Toc, the distribution of charge density on the first bitline BLa is positively corrected to the distance to the sense amplifier circuit (represented by horizontal axis of FIG. 6C). That is, the closer a portion of the first bitline BLa to the sense amplifier circuit, the higher the charge density thereon. With the propagation of the charge along the first bitline BLa, the distribution of the charge density on the first bitline BLa will eventually settle to an approximately constant distribution ("settled" line in FIG. 6C). Similar to those on the first bitline BLa, the voltage and distribution of charge density on the second bitline BLb may go through a similar change after Toc, which are depicted in FIGS. 6B and 6D, respectively.

In some embodiments, taken into consideration charge propagation on the bitlines, the voltages on the first bitline and the second bitline immediately after Toc may be larger (in term of magnitude) than the voltages needed to compensate the input-referred offset voltage.

In some embodiment, when the compensation circuit is configured to compensate the input-referred offset voltage by conducting charge injections to the first bitline and the second bitline, the charges injected to the bitlines (i.e., the first charge and the second charge) may be determined on the basis that the settled voltages on the first bitline BLa and the second bitline BLa (i.e., V1_settle and V2_settle, respectively) may compensate the input-referred offset voltage. The first charge and the second charge may be determined based on the electronic characteristics of the first bitline BLa and the second bitline BLb. More specifically, they may be determined based on factors including, but not limited to, bitline resistances $R_{BL}$ and bitline parasitic capacitance $C_{BL}$ associated with the first bitline BLa and the second bitline BLb. In some embodiments, a mathematical model may be established to depict the relationship between the injected charges to compensate the input-referred offset voltage and the electronic characteristics of the first bitline BLa and the second bitline BLb. Then the first charge and the second charge may be determined based on this mathematical model. The injected charges may be determined by other methods, and this invention is not limited in this regard. By taking into consideration charge propagation on the bitlines and the voltage deviations it causes, this method improves the accuracy of the input-referred offset voltage compensation.

It should be noted that, FIGS. 6A, 6B, 6C, and 6D show diagrams illustrating voltages and distributions of charge density on the first bitline BLa and the second bitline BLa in one specific compensation scenario (i.e., the compensation scenario shown in FIG. 5A). Based on similar principles, voltages and distributions of charge density on the bitlines on other compensation scenarios (e.g., the compensation scenario shown in FIG. 5B) may be obtained. Detail description of those compensation scenarios are omitted herein for the sake of conciseness.

Based on the aforementioned sense amplifier circuit operation method, this invention further provides a memory device operation method. The memory device in this operation method may include a wordline, a plurality of memory cells connected to the wordline, and a plurality of sense amplifier circuits each connected one of the plurality of memory cells. Each of the sense amplifier circuits may be the sense amplifier circuit of any one of the aforementioned embodiments. Relevant part in the aforementioned embodiments for the sense amplifier circuit may be referred to for detail composition of the sense amplifier circuit, which will not be repeatedly described herein for the sake of conciseness.

The plurality of sense amplifier circuits may be alternately arranged on a first side of the wordline and a second side of the wordline opposing the first side. The sense amplifier circuits arranged on the first side of the wordline may each have the first bitline connected to the corresponding memory cell, and the sense amplifier circuits arranged on the second side of the wordline may each have the second bitline connected to the corresponding memory cell.

The memory device operation method may further include: conducting a sense amplifier operation method for each of the sense amplifier circuits arranged on the first side of the wordline; and, subsequently, conducting the sense amplifier operation method for each of the sense amplifier circuits arranged on the second side of the wordline. The sense amplifier operation method may be the method described in the aforementioned embodiments, hence detail descriptions of the sense amplifier operation method are omitted herein for the sake of conciseness.

In the memory device operation method described above, the operation method that compensates the input-referred offset voltage of a sense amplifier circuit are first conducted for the sense amplifier circuits located on the first side of the wordline, and then conducted for the sense amplifier circuits located on the second side of the wordline. Thus, interference between the sense amplifier circuits located on different sides of the wordline may be reduced, if not eliminated.

2.2 Control Switch Circuits for Faster Read Speed

The sense amplifier circuit operation methods described above may further include methods to control the conductive statuses of the switch circuits of the sense amplifier circuit to improve read speed of data in a memory cell. FIGS. 7A and 7B show diagrams illustrating waveforms of the voltages on the first bitline and the second bitline of the sense amplifier circuit in accordance with one or more embodiments of this invention. The methods will be described below in details with reference to these drawings.

In some embodiments, the methods to control the conductive statuses of the switch circuits of the sense amplifier circuit may be conducted following the aforementioned sense amplifier circuit operation method. More specifically, the methods may be conducted following step S450 of the aforementioned methods (i.e., after the second switch circuit and the fourth switch circuit are switched on).

In some embodiments, one of the methods may include: after Step S450, disconnecting the sense amplifier circuit from the first bitline and the second bitline by operating the second switch circuit and the fourth switch circuit; keeping the sense amplifier circuit disconnected from the first bitline and the second bitline for a predetermined period of time; and reconnecting the sense amplifier circuit with the first bitline and the second bitline by operating the second switch circuit and the fourth switch circuit. This method will be described below in greater details.

Referring to FIG. 7A, at a time after the second switch circuit and the fourth switch circuit are switched on to amplify an input voltage signal (e.g., $t_s$), the first bitline BLa and the second bitline BLb may be disconnected from the sense amplifier circuit. This may be done by switching off the second switch circuit and the fourth switch circuit. When the bitlines are disconnected from the sense amplifier circuit, bitline resistances $R_{BL}$, and bitline parasitic capacitance $C_{BL}$ associated with the bitlines are disconnected from the sense amplifier circuit. Therefore the voltage signal may be amplified quicker than that when the bitlines are connected. The second switch circuit and the fourth switch circuit may remain switched off for a predetermined period of time (Δt in FIG. 7A). The predetermined period of time may be determined based on specific requirements, and is not limited in this invention. Then second switch circuit and the fourth switch circuit may be switched on to reconnect the bitlines to the sense amplifier circuit.

As shown in FIG. 7A, during a time period when the bitlines are disconnected (i.e., between $t_s$ and $t_e$), the voltage signal may be amplified quicker than that when the bitlines are connected. As a result, the voltages on the first bitline and the second bitline may reach the corresponding target values quicker than that when the bitlines have not been disconnected (e.g., $t_{r1}$ vs $t_{r0}$ in FIG. 7A). Thus, by disconnecting the first bitline and the second bitline from the sense amplifier circuit for a predetermined period of time, the sense amplifier circuit may amplify an input voltage signal to a desired amplitude quicker, thereby improving the reading speed of the corresponding memory cell.

As shown in FIG. 7A, when the first bitline BLa and the second bitline BLb are reconnected to the sense amplifier circuit (i.e., at $t_e$), since the bitline resistances $R_{BL}$, and bitline parasitic capacitance $C_{BL}$ are reconnected to the sense amplifier circuit, the voltages may be temporarily pulled back, which is undesired since it prolongs the reading time. To address this deficiency, when reconnecting the sense amplifier circuit with the first bitline BLa and the second bitline BLb, instead of completely switching on the second switch circuit and the fourth switch circuit (i.e., setting them on a 100% conductive status), the second switch circuit and the fourth switch circuit may be set at a partial conductive status, so that the adverse effect of the bitline resistances and bitline parasitic capacitance may be reduced. FIG. 7B shows waveforms of the voltages when the second switch circuit and the fourth switch circuit are set at a partial conductive status when reconnecting to the sense amplifier circuit. As shown in FIG. 7B, when the first bitline BLa and the second bitline BLb are reconnected and each of the second switch circuit and the fourth switch circuit is set at a partial conductive status (i.e., at $t_e$), the voltages on the first bitline BLa and the second bitline BLb are pulled back less when compared to that in FIG. 7A. Hence a faster reading speed can be achieved.

In some embodiments, the aforementioned methods to control the conductive statuses of the switch circuits of the sense amplifier circuit may also be conducted on a sense amplifier circuit without first performing the aforementioned sense amplifier circuit operation method. More specifically, the methods may be conducted on a sense amplifier circuit that is connected to a first bitline through a first bitline switch circuit, and connected to a second bitline through a second bitline switch circuit. The sense amplifier circuit may be configured to amplify a voltage signal applied between the first bitline and the second bitline.

One of the methods may include: while the sense amplifier circuit amplifying the voltage signal, disconnecting the sense amplifier circuit from the first bitline and the second bitline by operating the first bitline switch circuit and the second bitline switch circuit; keeping the sense amplifier circuit disconnected from the first bitline and the second bitline for a predetermined period of time; and reconnecting the sense amplifier circuit with the first bitline and the second bitline by operating the first bitline switch circuit and the second bitline switch circuit.

In some embodiments, in the aforementioned method, when reconnecting the sense amplifier circuit with the first bitline and the second bitline, each of the first bitline switch circuit and the second bitline switch circuit may be set at a partial conductive status.

2.3 Calibrate for Variation on Voltage Pulling Capabilities

This invention further provides a calibration circuit configured to perform a calibration operation to determine a pull-up circuit, a pull-down circuit, a pull-up voltage (Vpup) and a pull-down voltage (Vpdn) for a sense amplifier circuit. FIG. 8 shows a calibration circuit for a sense amplifier circuit in accordance with one embodiment of this invention.

As shown in FIG. 8, the calibration circuit may include a duplication inverting amplifier. The duplicated inverting amplifier may include a first duplicate transistor M10 and a second duplicate transistor M20. The duplicated inverting amplifier may be a duplication of the aforementioned first inverting amplifier. That is, in the duplicated inverting amplifier, the first duplicate transistor M10 and the second duplicate transistor M20 may be a duplication of the first transistor M1 and the second transistor M2 in the aforementioned sense amplifier circuit, respectively. In some embodiments, the duplicated inverting amplifier may be a duplication of the second inverting amplifier in the aforementioned sense amplifier circuit. The duplicated inverting amplifier may be other suitable circuit based on specific needs, and may have electronic characteristics that are the same with or different from that of the first inverting amplifier or the second inverting amplifier. This invention is not limited in this regard.

In some embodiments, in the duplicated inverting amplifier, each of the first duplicate transistor M10 and the second duplicate transistor M20 may have a first terminal, a second terminal, and a gate terminal. The gate terminal of the first duplicate transistor M10 may be connected to the gate terminal of the second duplicate transistor M20 at an output node z. The second terminal of the first duplicate transistor M10 may be connected with the first terminal of the second duplicate transistor M20, the first terminal of the first duplicate transistor M10 may be connected to a voltage node sapwr0, and the second terminal of the second duplicate transistor M20 may be connected to a ground node sagnd0.

The voltage node sapwr0 may be provided with a plurality of pull-up circuits with different voltage pull-up capabilities, and the ground node may be provided with a plurality of pull-down circuits with different voltage pull-down capabilities. One or more pull-up circuits from the plurality of pull-up circuits may be selected to be coupled to the voltage node sapwr0, and one or more pull-down circuits from the plurality of pull-down circuits may be selected to be coupled to the ground node sagnd0. A pull-up voltage may be provided to the duplicated inverting amplifier through the selected one or more pull-up circuits, and a pull-down voltage may be provided to the duplicated inverting amplifier through the selected one or more pull-down circuits.

As shown in FIG. 8, in some embodiments, the plurality of pull-up circuits may be three pull-up circuits with different voltage pull-up capabilities, and the plurality of pull-down circuits may be three pull-down circuits with different voltage pull-down capabilities.

An output voltage of the duplicated inverting amplifier at the output node z may be sent to a feedback circuit. A calibration voltage may be provided to the feedback circuit to be compared with the output voltage. The calibration voltage may be a desired voltage at the node z. In one example, the calibration voltage may be half of a source voltage VH (i.e., ½ VH). An output of the feedback circuit may be provided to a calibration control circuit. The calibration control circuit may adjust, based on a comparison result between the calibration voltage and the output voltage, the pull-up voltage Vpup and the pull-down voltage Vpdn to cause the output voltage to tune towards the calibration voltage.

FIG. 9 shows a flowchart illustrating a calibration process in accordance with one embodiment of this invention. The calibration process will be described below with reference to FIG. 9.

As shown in FIG. 9, the calibration process may include the following steps S910 through S930.

In step S910, one or more candidate pull-up circuits may be selected from a plurality of candidate pull-up circuits, and one or more candidate pull-down circuits may be selected from a plurality of candidate pull-down circuits according to a calibration voltage. The one or more candidate pull-up circuits and the one or more candidate pull-down circuits may be selected to cause an output voltage at the output node z to approach the calibration voltage. More specific, the candidate pull-up circuits and the candidate pull-down circuits may be selected on the basis that they produce an output voltage at the output node z that is closer to the calibration voltage than any other combination of candidate pull-up circuits and candidate pull-down circuits. In this step, a candidate pull-up voltage Vpup may be provided to the selected one or more candidate pull-up circuits, and a candidate pull-down voltage Vpdn may be provided to the selected one or more candidate pull-down circuits.

In step S920, the pull-up voltage Vpup and the pull-down voltage Vpdn may be adjusted to cause the output voltage to further approach the calibration voltage.

In step S930, the adjusted pull-up voltage Vpup and the adjusted pull-down voltage Vpdn may be saved in one or more registers.

The candidate pull-up voltage Vpup and the candidate pull-down voltage Vpdn stored in the one or more registers may be used in the aforementioned method for compensating an input-referred offset voltage of a sense amplifier circuit. That is, in the aforementioned method, providing a pull-up voltage to the voltage node may comprise: coupling the selected one or more candidate pull-up circuits to the voltage node; and providing the adjusted candidate pull-up voltage through the selected one or more candidate pull-up circuits to the voltage node. Providing the pull-down voltage to the ground node may comprise: coupling the selected one or more candidate pull-down circuits to the ground node; and providing the adjusted candidate pull-down voltage through the selected one or more candidate pull-down circuits to the ground node.

Additionally, for a memory device including a plurality of sense amplifier circuits (i.e., a SA array), the candidate pull-up voltage and the candidate pull-down voltage stored in the one or more registered may be used as a pull-up voltage and a pull-down voltage, respectively, for each of the plurality of sense amplifier circuit.

In some embodiments, the calibration circuit may further include a timing unit configured for setting a fixed time interval, and the calibration circuit may be further configured to perform the calibration process repeatedly at the fixed time interval. Thus, the pull-up voltage Vpup and the pull-down voltage Vpdn may be periodically adjusted according to changed conditions (e.g., temperature) or operational needs. In some embodiments, the fixed time interval may be 100 ms.

In the calibration process described above, by selecting one or more proper pull-up circuits from a plurality of candidate pull-up circuits, selecting one or more proper pull-down circuits from a candidate plurality of pull-down circuits, and by adjusting the pull-up voltage Vpup and the pull-down voltage Vpdn, the output voltage of the duplicated inverting amplifier may be as close to the calibration voltage (e.g., ½ VH) as possible. Thus, the difference between the voltage pulling capabilities of the pull-up circuit and the pull-down circuit may be compensated.

3. Determination of Time of Compensation (Toc)

The Toc of the aforementioned compensation process may be chosen so that the voltage difference between the first bitline BLa and the second bitline BLb (i.e., the compensation voltage) at the end of step S430 may reflect an input-referred offset voltage of the sense amplifier circuit, so that the input-referred offset voltage may be properly compensated. For example, the voltage difference may have a substantially same magnitude with an input-referred offset voltage.

The Toc may be determined based on various factors including, but not limited to, the transconductance of the sense amplifier circuit as a whole $G_m$, the bitline resistance $R_{BL}$, and the bitline parasitic capacitance $C_{BL}$. That is, the Toc may be determined by an equation of:

$$Toc = f(G_m, R_{BL}, C_{BL})$$

In some embodiments, when determining the Toc, charge propagation on the bitlines may be taken into consideration, and the Toc may be determined so that the charges injected to the first bitline BLa and the second bitline BLa may, after fully propagated on the bitlines, generate a compensation voltage between the bitlines that compensates the input-referred offset voltage.

The Toc of a sense amplifier circuit may be determined through different methods. In one embodiment, the Toc may be determined by first establishing a mathematical model to obtain an analytical solution for the Toc, and then calculating the Toc based on the analytical solution. In another embodiment, the Toc may be obtained through a lookup table of the Toc. More specifically, a lookup table of the Toc on different conditions may first be established based on experimental data. The lookup table may include a plurality of compensation durations, each corresponding to one specific condition (i.e., when each of the factors, such as the transconductance $G_m$, the bitline resistance $R_{BL}$, and a bitline parasitic capacitor $C_{BL}$, is at a specific value). Then, a current condition may be determined. Current condition may include current value for each of the aforementioned factors, which may include, by not be limited to the transconductance $G_m$, the bitline resistance $R_{BL}$, and the bitline parasitic capacitor $C_{BL}$. The Toc then may be determined by finding in the lookup table the compensation duration corresponding to the current condition.

FIG. 10A shows a diagram illustrating a circuit to determine the time of compensation in accordance with one embodiment of this invention. Referring to FIG. 10A, the circuit to determine the time of compensation may be a feedback circuit and may include a sense amplifier (SA) circuit, a determination circuit, one or more counter/register, a delay generation circuit, and a switch control circuit. An output of the SA circuit may be provided to the determination circuit, which may determine, based on the output and a pre-determined condition, whether a desired time of compensation has been reached. The determination circuit may be connected to one or more counter/register, which may be further connected to the delay generation circuit. The one or more counter/register and the delay generation circuit may be used to generate a delay signal according to the output of the determination circuit, the delay signal may be sent to the switch control circuit, and the switch control circuit may apply a Toc on the SA circuit based on the delay signal.

FIG. 10B shows a flowchart illustrating a method to determine the time of compensation in accordance with one embodiment of this invention. Referring to FIG. 10B, the method to determine the time of compensation may include the following steps S1010 to S1070.

In step S1010, an equalization (EQ) process may be conducted on a sense amplifier (SA) circuit. That is, the SA circuit may have its two input bitlines connected to reset the SA circuit.

In step S1020, the two input bitlines of the SA circuit are separated, and one of the input bitlines may be selected to be read data (e.g., 0 or 1) thereon.

In step S1030, an EQ process may be conducted the SA circuit to reset the SA circuit.

In step S1040, after the EQ process, one Time of compensation $T_i$ from a Time of compensation series ($T_i$, i=1, 2, . . . ) may be selected and applied on the SA circuit.

In step S1050, after the Toc, the data on the selected input bitlines may be read.

In step S1060, the data read from the selected input bitline may be compared with the data read in step S1020 to determine whether a change has occurred (i.e., changing from 0 to 1, or from 1 to 0).

If the data has changed, then the method is completed, and $T_i$ is the determined Time of compensation (step S1070 in FIG. 10B). If the data has not changed, then the method may return to step S1030, and another Time of compensation may be chosen to steps S1030 to S1060 may be repeated until a data change occurs.

In some embodiments, the Time of compensation series ($T_i$, i=1, 2, . . . ) may include a plurality of monotonic increasing or decreasing values for Time of compensation.

4. Compensation Circuits for Constant Toc

The transconductance of the sense amplifier circuit $G_m$, the bitline resistance $R_{BL}$, and the bitline parasitic capacitor $C_{BL}$ may change with changed conditions (e.g., temperature), which may affect the Toc and hence the accuracy of the compensation.

This invention further presents circuits and related methods that provide compensation to the transconductance of the sense amplifier circuit Gm, the bitline resistance $R_{BL}$, and the bitline parasitic capacitor $C_{BL}$, respectively, to accommodate for changed conditions, so that the Toc of an amplifier circuit may remain relatively unchanged.

FIG. 11 shows a diagram illustrating a sense amplifier circuit including a transconductance compensation circuit in accordance with some embodiments of this invention. As shown in FIG. 11, in some embodiments, a sense amplifier circuit with a transconductance compensation circuit may include a transconductance compensation circuit coupled to the sense amplifier circuit (SA circuit). In some embodiments, the transconductance compensation circuit may be coupled to, and be configured to provide compensation currents for, the pull-up circuit and the pull-down circuit of the sense amplifier circuit. The transconductance compensation circuit may include a temperature sensor sensing a temperature and be configured to provide compensation currents to the pull-up circuit and the pull-down circuit of the sense amplifier circuit according to the sensed temperature.

In some embodiments, the transconductance compensation circuit may include two constant-Gm circuits, each respectively coupled with the pull-up circuit and the pull-down circuit of the sense amplifier circuit. Other circuits that can adjust a transconductance of the sense amplifier circuit according to external conditions may be used, and this invention is not limited in this regard.

FIGS. 12A and 12B show diagrams illustrating a memory device including circuits for compensating bitline resistance in accordance with some embodiments of this invention. FIG. 13 shows a diagram illustrating a memory device including circuits for compensating bitline parasitic capacitance in accordance with one embodiment of this invention. These memory devices will be described below with reference to these drawings.

In one example, a memory device may include a wordline, a plurality of memory cells connected to the wordline and a plurality of sense amplifier circuits each connected to one of the plurality of memory cells. The sense amplifier circuit herein may be a sense amplifier circuit in any one of the aforementioned embodiments. Relevant part in the aforementioned embodiments for the sense amplifier circuit may be referred to for detail composition of the sense amplifier circuit, which will not be repeatedly described herein for the sake of conciseness.

In some embodiments, in the memory device, each of the first switch circuit, the second switch circuit, the third switch circuit, and the fourth switch circuit in each of the plurality of sense amplifier circuits comprises an N-type metal-oxide-semiconductor (NMOS) transistor, a P-type metal-oxide-semiconductor (PMOS) transistor, or a transmission gate.

In some embodiments, the memory device may include a dummy bitline configured to generate a bias voltage applying on at least one of the first switch circuit, the second switch circuit, the third switch circuit, and the fourth switch circuit in each of the plurality of sense amplifier circuits. The bias voltage may control a conductive state of the corresponding switch circuit.

In some embodiments, as shown in FIG. 12A, in the memory device, each of the memory cells may be connected to a corresponding sense amplifier circuit through an input transistor. The memory device may further include a dummy bitline coupled to at least one of the input transistors and a control circuit. The control circuit may be configured to generate a control signal (e.g., a bias voltage VBIAS1), which may be, through the dummy bitline, applied on the at least one of the input transistors to adjust a resistance of the at least one input transistor. By adjusting the resistance of the at least one input transistor according to change external conditions, the bitline resistance $R_{BL}$ connected to each switch circuit may be compensated.

As shown in FIG. 12B, in another example, each of the memory cells may be connected to a corresponding sense amplifier circuit through an adjustable resistor. The memory device may further include a dummy line coupled to at least one of the adjustable resistors and a resistance control circuit. The resistance control circuit may be configured to generate a resistance control signal. The dummy bitline may be configured to transmit the a resistance control signal to the at least one adjustable resistor for controlling a resistance of the at least one adjustable resistor. By adjusting the resistance of the at least one adjustable resistor according to changed conditions, the resistance connected on each bitline of the sense amplifier circuit may be adjusted to compensate the changed bitline resistance $R_{BL}$.

In some embodiments, the memory device may be connected with a reference resistor, which may be a standard resistor whose resistance under a specific condition has been accurately determined. The resistance of the adjustable resistors may be adjusted based on measured resistance of the reference resistor under current condition to compensate the changed bitline resistance $R_{BL}$. In one example, the reference resistor may be connected in a voltage-dividing circuit, and the resistance of the reference resistor under current condition may be determined by measuring the voltage on the reference resistor. Other suitable methods may also be used to measure the resistance of the reference resistor under current condition, and this invention is not limited in this regard.

As shown in FIG. 13, in another example, each of the memory cells may be connected to a corresponding sense amplifier circuit through an adjustable capacitor. In some embodiments, the adjustable capacitor may be a P-N junction capacitor, whose capacitance may be adjusted by a voltage applied on a gate node of the P-N junction. In some embodiments, the adjustable capacitor may include a plurality of capacitors that can be serially or parallelly connected with each other. A capacitor adjusting circuit may be coupled with the plurality of capacitors, and may be configured to select one or more capacitors from the plurality of capacitors to be connected to the sense amplifier circuit, thereby adjusting the capacitance of the adjustable capacitor.

The memory device may further include a dummy bitline coupled to at least one of the adjustable capacitors and a capacitance control circuit. The capacitance control circuit may be configured to generate a capacitance control signal. The dummy bitline may be configured to transmit the capacitance control signal to the at least one of the adjustable capacitors for controlling a capacitance of the at least one adjustable capacitor. In one example, the capacitance control signal may be provide to the corresponding capacitor adjusting circuit to adjust the capacitance of the at least one adjustable capacitor. By adjusting the capacitance of the at least one adjustable capacitor according to changed external conditions, the capacitance connected on each bitline of the sense amplifier circuit may be adjusted to compensate the bitline parasitic capacitor $C_{BL}$.

In some embodiments, the memory device may include a memory cell matrix comprising a plurality of rows of memory cells and a plurality of columns of memory cells. Each column of memory cells may be connected to one bitline, and each row of memory cells may be connected to one wordline. In this case, one dummy bitline may be provided for every predetermined number of bitlines. In one example, the predetermined number may be 100. The predetermined number may be determined according to specific requirement, and this invention is not limited in this regard.

Based on the aforementioned sense amplifier circuit and operation methods thereof, this invention further provides an input-referred offset voltage compensation method, applicable to an amplifier circuit. The method may include: connecting a first node of the amplifier circuit with a second node of the amplifier circuit through a control circuit coupled to the amplifier circuit to cause voltages on the first node and the second node to converge; separating the first node from the second node through the control circuit; determining a time of compensation; powering on the amplifier circuit for the time of compensation to generate a first signal and a second signal, wherein the first signal is generated at the first node, and the second signal is generated at the second node; and routing the first signal to the second node, and the second signal to the first node through the control circuit to compensate an input-referred offset voltage of the amplifier circuit.

In some embodiments, in the aforementioned method, the input-referred offset voltage of the amplifier circuit may include a difference between threshold voltages of corresponding transistors in the amplifier circuit, and powering on the amplifier circuit for a time of compensation to generate a first signal and a second signal may include: determining the time of compensation; and powering on the amplifier circuit for the time of compensation to generate the first signal and the second signal. A different between the first signal and the second signal reflects the difference between the threshold voltages.

In some embodiments, in the aforementioned method, determining the time of compensation may include: determining the time of compensation based on a transconductance of the amplifier circuit, a bitline resistance, and a bitline parasitic capacitance of the amplifier circuit.

In some embodiments, in the aforementioned method, determining the time of compensation may include: establishing a lookup table for the time of compensation, wherein the lookup table may include a plurality of compensation durations each corresponding to one specific condition; determining a current condition; and determining the time of compensation by finding the compensation duration in the lookup table corresponding to the current condition.

In some embodiments, in the aforementioned method, powering on the amplifier circuit for the time of compensation to generate a first signal and a second signal may include: powering on the amplifier circuit by providing a pull-up voltage and a pull-down voltage to the amplifier circuit. The aforementioned method may further include: conducting a calibration process to determine the pull-up voltage and the pull-down voltage.

In some embodiments, the aforementioned method may further include: receiving an input signal pair for amplification on the first node and the second node, respectively. The input signal pair may be superimposed with the second signal on the first node and the first signal on the second node, respectively.

This invention further provides another input-referred offset voltage compensation method, applicable to an amplification circuit having a first sub-circuit and a second sub-circuit, and having an input-referred offset voltage. The method may include generating a first signal by the first sub-circuit on a first I/O of the amplification circuit, and a second signal by the second sub-circuit on a second I/O of the amplification circuit in response to a voltage signal, wherein a difference between the first signal and the second signal reflects the input-referred offset voltage in the circuit;

and connecting the first signal to the second I/O, and the second signal to the first I/O by a compensation circuit coupled to the amplification circuit to compensate the input-referred offset voltage.

In some embodiments, in the aforementioned circuit, the compensation circuit may include: a first switch circuit, a second switch circuit, a third switch circuit, and a fourth switch circuit. A first end of the first switch circuit may be connected to a first end of the second switch circuit at the first I/O. A first end of the third switch circuit may be connected to a first end of the fourth switch circuit at the second I/O. A second end of the first switch circuit may be connected to a second end of the fourth switch at an output of the second sub-circuit, and a second end of the second switch circuit may be connected to a second end of the third switch circuit at an output of the first sub-circuit.

In some embodiments, in the aforementioned method, generating a first signal by the first sub-circuit on a first I/O of the amplification circuit, and a second signal by the second sub-circuit on a second I/O of the amplification circuit may include: generating, by operating the first, the second, the third, and the fourth switch circuits, the first signal by the first sub-circuit on the first I/O and the second signal by the second sub-circuit on the second I/O.

In the aforementioned method, through a compensation circuit, the first signal is connected to the second I/O, and the second signal is connected to the first I/O. When the circuit accepting an input signal from the first I/O and the second I/O, the input signal is superimposed with the first signal and the second signal, therefore the input-referred offset voltage of the circuit may be compensated.

The accompanying drawings are merely illustrative of a series of processes included in the method according to some embodiments of this invention and are not intended to be limiting. It will be readily appreciated that the way in which the processes are illustrated does not indicate any chronological order of them or limit them to a particular chronological order. Furthermore, it will also be readily appreciated that the processes may be performed, for example, synchronously or asynchronously in multiple modules.

Other embodiments of this invention will be apparent to those skilled in the art from considering the specification and practicing the embodiments disclosed herein. Accordingly, this disclosure is intended to cover all and any variations, uses, or adaptations of this invention which follow, in general, the principles thereof and include such departures from this invention as come within common knowledge or customary practice within the art to which this invention pertains. It is also intended that the specification and examples be considered as exemplary only, with true scope and spirit of this invention being indicated by the appended claims.

The invention claimed is:

1. A sense amplifier circuit, comprising:
an amplification circuit, comprising:
a first inverting amplifier and a second inverting amplifier, wherein an input of the first inverting amplifier is connected to an output of the second inverting amplifier at a first node, and an input of the second inverting amplifier is connected to an output of the first inverting amplifier at a second node, wherein the first inverting amplifier comprises a first transistor and a second transistor, a gate terminal of the first transistor and a gate terminal of the second transistor are directly connected together to form the input of the first inverting amplifier at the first node; the second inverting amplifier comprises a third transistor and a fourth transistor, and a gate terminal of the third transistor and a gate terminal of the fourth transistor are directly connected together to form the input of the second inverting amplifier at the second node; and
a compensation circuit coupled to the amplification circuit and configured to:
in an equalization stage, control a first bitline to connect to the first node and the second node, and control a second bitline to connect to the first node and the second node; and
in an offset compensation stage, switch off a connection between the first bitline and the second node, and switch off a connection between the second bitline and the first node, at least remain on a connection between the first bitline and the first node or remain on a connection between the second bitline and the second node.

2. The sense amplifier circuit of claim 1, wherein at least remain on a connection between the first bitline and the first node or remain on a connection between the second bitline and the second node comprises at least one of the following:
injecting a first charge generated by the first inverting amplifier to the second bitline; or
injecting a second charge generated by the second inverting amplifier to the first bitline,
wherein at least one of the first charge or the second charge generate a compensation voltage between the first bitline and the second bitline after a distribution of at least one of the first charge or the second charge on the bitlines settled, and the compensation voltage is within ±10% of the input-referred offset voltage of the amplification circuit.

3. The sense amplifier circuit of claim 2, wherein the compensation circuit includes one or more capacitive elements.

4. The sense amplifier circuit of claim 3, wherein the one or more capacitive elements comprise a Ni capacitor or a bitline parasitic capacitor.

5. The sense amplifier circuit of claim 1,
wherein the first inverting amplifier and the second inverting amplifier are both connected to a voltage node, and both connected to a ground node.

6. The sense amplifier circuit of claim 5, further comprising:
a transconductance compensation circuit coupled to a pull-up circuit and a pull-down circuit, the pull-up circuit coupled to the voltage node and the pull-down circuit coupled to the ground node,
wherein the transconductance compensation circuit comprises a temperature sensor sensing a temperature, and is configured to provide compensation currents to the pull-up circuit and the pull-down circuit, respectively, to compensate a change of a transconductance of the sense amplifier circuit due to a change of the temperature.

7. The sense amplifier circuit of claim 5,
wherein a second terminal of the first transistor and a first terminal of the second transistor are connected to the second node, a second terminal of the third transistor and a first terminal of the fourth transistor are connected to the first node, a first terminal of the first transistor and a first terminal of the third transistor are connected to the voltage node, and a second terminal of the second transistor and a second terminal of the fourth transistor are connected to the ground node.

8. The sense amplifier circuit of claim 1, wherein the compensation circuit comprises:
   a first switch circuit;
   a second switch circuit;
   a third switch circuit; and
   a fourth switch circuit,
   wherein a first end of the first switch circuit is connected to a first end of the second switch circuit at the first bitline, a first end of the third switch circuit is connected to a first end of the fourth switch circuit at the second bitline, a second end of the first switch circuit is connected to a second end of the fourth switch circuit at the first node, and a second end of the second switch circuit is connected to a second end of the third switch circuit at the second node.

9. The sense amplifier circuit of claim 8, wherein each of the first switch circuit, the second switch circuit, the third switch circuit, and the fourth switch circuit comprises an N-type metal-oxide-semiconductor (NMOS) transistor, a P-type metal-oxide-semiconductor (PMOS) transistor, or a transmission gate.

10. The sense amplifier circuit of claim 9, further comprising a switch control circuit coupled to the first switch circuit, the second switch circuit, the third switch circuit, and the fourth switch circuit,
   wherein the switch control circuit is configured to control a conductive status of each of the first switch circuit, the second switch circuit, the third switch circuit, and the fourth switch circuit.

11. The sense amplifier circuit of claim 8, wherein the compensation circuit is configured to generate, by operating the first, the second, the third, and the fourth switch circuits, a compensation voltage between the first bitline and the second bitline to compensate the input-referred offset voltage of the amplification circuit.

12. The sense amplifier circuit of claim 11, wherein generating a compensation voltage between the first bitline and the second bitline to compensate the input-referred offset voltage of the amplification circuit comprises:
   switching on the first switch circuit, the second switch circuit, the third switch circuit, and the fourth switch circuit;
   switching off the second switch circuit and the fourth switch circuit for a time of compensation to generate the compensation voltage between the first bitline and the second bitline; and
   switching off the first switch circuit and the third switch circuit.

13. An input-referred offset voltage compensation method, applicable to the sense amplifier circuit of claim 8, the method comprising:
   generating, by operating the first, the second, the third, and the fourth switch circuits, a compensation voltage between the first bitline and the second bitline to compensate the input-referred offset voltage of the amplification circuit.

14. The method of claim 13, wherein generating a compensation voltage between the first bitline and the second bitline to compensate the input-referred offset voltage of the amplification circuit comprises:
   switching on the first switch circuit, the second switch circuit, the third switch circuit, and the fourth switch circuit;
   determining a time of compensation;
   switching off the second switch circuit and the fourth switch circuit for the time of compensation to generate the compensation voltage between the first bitline and the second bitline; and
   switching off the first switch circuit and the third switch circuit.

15. The method of claim 14, wherein a voltage difference between near-ends of the first bitline and the second bitline is larger than the input-referred offset voltage of the amplification circuit at the end of the time of compensation.

16. The method of claim 15, wherein the voltage difference between the near-ends of the first bitline and the second bitline is 10%-40% larger than the input-referred offset voltage of the amplification circuit at the end of the time of compensation.

17. The method of claim 14, wherein a gain of the sense amplifier circuit is larger than one during the time of compensation.

18. The method of claim 14, wherein switching on the first switch circuit, the second switch circuit, the third switch circuit, and the fourth switch circuit comprises:
   switching on the first switch circuit, the second switch circuit, the third switch circuit, and the fourth switch circuit to cause voltages on the first bitline, the second bitline, the output of the first inverting amplifier and the output of the second inverting amplifier converge to one voltage level.

19. The method of claim 14, wherein determining the time of compensation comprises:
   determining, based on a transconductance of the amplifier circuit, a bitline resistance, and a bitline parasitic capacitance of the amplifier circuit, the time of compensation.

20. The method of claim 14, wherein determining the time of compensation comprises:
   establishing a lookup table for the time of compensation, wherein the lookup table includes a plurality of compensation durations each corresponding to one specific condition;
   determining a current condition; and
   determining the time of compensation by finding the compensation duration in the lookup table corresponding to the current condition.

21. The method of claim 14, wherein powering on the amplifier circuit for the time of compensation to generate a first signal and a second signal comprises:
   powering on the amplifier circuit by providing a pull-up voltage and a pull-down voltage to the amplifier circuit, and wherein the method further comprises:
   conducting a calibration process to determine the pull-up voltage and the pull-down voltage.

22. The method of claim 14, further comprising;
   receiving an input signal pair for amplification on the first node and the second node, respectively, wherein the input signal pair is superimposed with the second signal on the first node and the first signal on the second node, respectively.

23. The method of claim 13, further comprising: after generating the compensation voltage between the first bitline and the second bitline,
   providing an input signal between the first bitline and the second bitline;
   providing a pull-up voltage to the voltage node;
   providing a pull-down voltage to the ground node; and
   switching on the second switch circuit and the fourth switch circuit to amplify the input signal, while the first switch circuit and the third switch circuit remain off.

24. The method of claim 23, further comprising: after switching on the second switch circuit and the fourth switch circuit to amplify the input signal,
- disconnecting, by operating the second switch circuit and the fourth switch circuit, the sense amplifier circuit from the first bitline and the second bitline;
- keeping the sense amplifier circuit disconnected from the first bitline and the second bitline for a predetermined period of time; and
- reconnecting, by operating the second switch circuit and the fourth switch circuit, the sense amplifier circuit with the first bitline and the second bitline.

25. The method of claim 24, wherein reconnecting the sense amplifier circuit with the first bitline and the second bitline comprises:
- reconnecting, by setting each of the second switch circuit and the fourth switch circuit at a partial conductive status, the sense amplifier circuit with the first bitline and the second bitline.

26. The method of claim 23, further comprising:
conducting a calibration process, comprising:
- selecting one or more candidate pull-up circuits from a plurality of candidate pull-up circuits to couple to a voltage node of a duplicated inverting amplifier, and selecting one or more candidate pull-down circuits from a plurality of candidate pull-down circuits to couple to a ground node of the duplicated inverting amplifier, to cause an output voltage of the duplicated inverting amplifier to approach a calibration voltage;
- adjusting a candidate pull-up voltage provided to the selected one or more candidate pull-up circuits, and adjusting a candidate pull-down voltage provided to the one or more selected candidate pull-down circuits to cause the output voltage to further approach the calibration voltage; and
- storing the adjusted candidate pull-up voltage and the adjusted candidate pull-down voltage in a register.

27. The method of claim 26, wherein the duplicated inverting amplifier is a duplication circuit of the first inverting amplifier or the second inverting amplifier.

28. The method of claim 26, wherein conducting a calibration process comprises:
- conducting the calibration process repeatedly at a fixed time interval.

29. The method of claim 28, wherein the fixed time interval is 100 ms.

30. The method of claim 26, wherein providing a pull-up voltage to the voltage node comprises:
- coupling the selected one or more candidate pull-up circuits to the voltage node; and
- providing the adjusted candidate pull-up voltage through the selected one or more candidate pull-up circuits to the voltage node, and wherein providing the pull-down voltage to the ground node comprises:
- coupling the selected one or more candidate pull-down circuits to the ground node; and providing the adjusted candidate pull-down voltage through the selected one or more candidate pull-down circuits to the ground node.

31. A memory device, comprising:
a plurality of memory cells; and
a plurality of sense amplifier circuits, wherein each of the plurality of sense amplifier circuits is the sense amplifier circuit of claim 1,
wherein, for each of the plurality of sense amplifier circuits, each of the first bitline and the second bitline is connected to one of the plurality of memory cells.

32. The memory device of claim 31, wherein in each of the plurality of sense amplifier circuits, at least remain on a connection between the first bitline and the first node or remain on a connection between the second bitline and the second node comprises at least one of:
- injecting a first charge generated by the first inverting amplifier to the second bitline; or
- injecting a second charge generated by the second inverting amplifier to the first bitline,
- wherein at least one of the first charge or the second charge generate a compensation voltage between the first bitline and the second bitline after a distribution of at least one of the first charge or the second charge on the bitlines settled, and the compensation voltage is within ±10% of the input-referred offset voltage of the amplification circuit.

33. The memory device of claim 31, wherein in each of the plurality of sense amplifier circuits, the compensation circuit comprises:
- a first switch circuit;
- a second switch circuit;
- a third switch circuit; and
- a fourth switch circuit,
- wherein a first end of the first switch circuit is connected to a first end of the second switch circuit at the first bitline, a first end of the third switch circuit is connected to a first end of the fourth switch circuit at the second bitline, a second end of the first switch circuit is connected to a second end of the fourth switch circuit at an output of the second inverting amplifier, a second end of the second switch circuit is connected to a second end of the third switch circuit at an output of the first inverting amplifier.

34. The memory device of claim 33, wherein each of the first switch circuit, the second switch circuit, the third switch circuit, and the fourth switch circuit in each of the plurality of sense amplifier circuits comprises an N-type metal-oxide-semiconductor (NMOS) transistor, a P-type metal-oxide-semiconductor (PMOS) transistor, or a transmission gate.

35. The memory device of claim 31, wherein in each of the plurality of sense amplifier circuits, a bias voltage is provided to at least one of the first switch circuit, the second switch circuit, the third switch circuit, and the fourth switch circuit to control a conductive state of the corresponding switch circuit.

36. The memory device of claim 31, wherein each of the memory cells is connected to a corresponding sense amplifier circuit through an adjustable resistor,
and wherein the memory device further comprises:
- a dummy bitline coupled to at least one of the adjustable resistors and a resistance control circuit,
- wherein the resistance control circuit is configured to generate a resistance control signal, and the dummy bitline is configured to transmit the resistance control signal to the at least one of the adjustable resistors for controlling a resistance of the at least one of the adjustable resistors.

37. The memory device of claim 36, wherein the memory device is connected with a reference resistor, and the resistance control signal is generated based on a measured resistance of the reference resistor.

38. The memory device of claim 31, wherein each of the memory cells is connected to a corresponding sense amplifier circuit through an adjustable capacitor,
and wherein the memory device further comprises:
- a dummy bitline coupled to at least one of the adjustable capacitors and a capacitance control circuit, wherein the capacitance control circuit is configured to generate a capacitance control signal, wherein the dummy bitline is configured to transmit the capacitance control signal to the at least one of the adjustable capacitors for controlling a capacitance of the at least one of the adjustable capacitors.

39. A method to operate a sense amplifier circuit, applicable to the sense amplifier circuit of claim 1, wherein the sense amplifier circuit is connected to a first bitline through a first bitline switch circuit, and connected to a second bitline through a second bitline switch circuit, and the sense amplifier circuit is configured to amplify a voltage signal applied between the first bitline and the second bitline, the method comprising:
while the sense amplifier circuit amplifying the voltage signal, disconnecting, by operating the first bitline switch circuit and the second bitline switch circuit, the sense amplifier circuit from the first bitline and the second bitline;
keeping the sense amplifier circuit disconnected from the first bitline and the second bitline for a predetermined period of time; and
reconnecting, by operating the first bitline switch circuit and the second bitline switch circuit, the sense amplifier circuit with the first bitline and the second bitline.

40. The method of claim 39, wherein reconnecting the sense amplifier circuit with the first bitline and the second bitline comprises:
reconnecting, by setting each of the first bitline switch circuit and the second bitline switch circuit at a partial conductive status, the sense amplifier circuit with the first bitline and the second bitline.

41. The sense amplifier circuit of claim 1, wherein in the offset compensation stage, remain on a connection between the first bitline and the first node, remain on a connection between the second bitline and the second node until an amount of charges injected into the first bitline and the second bitline is equal to a pre-calculated amount of charges that is able to compensate an input-referred offset voltage of the amplification circuit;
switch off the connection between the first bitline and the first node, and switch off the connection between the second bitline and the second node.

42. The sense amplifier circuit of claim 1,
wherein a gain of the sense amplifier circuit is larger than one during the offset compensation stage.

43. A sense amplifier circuit, comprising:
an amplification circuit, comprising:
a first inverting amplifier and a second inverting amplifier, wherein an input of the first inverting amplifier is connected to an output of the second inverting amplifier at a first node, and an input of the second inverting amplifier is connected to an output of the first inverting amplifier at a second node, wherein the first inverting amplifier comprises a first transistor and a second transistor, a gate terminal of the first transistor and a gate terminal of the second transistor are directly connected together to form the input of the first inverting amplifier at the first node; the second inverting amplifier comprises a third transistor and a fourth transistor, and a gate terminal of the third transistor and a gate terminal of the fourth transistor are directly connected together to form the input of the second inverting amplifier at the second node; and
a compensation circuit coupled to the amplification circuit and configured to:
in a equalization stage, control a first bitline to connect to the first node and the second node, and control a second bitline to connect to the first node and the second node;
in an offset compensation stage, switch off a connection between the first bitline and the second node, and switch off a connection between the second bitline and the first node, at least remain on a connection between the first bitline and the first node or remain on a connection between the second bitline and the second node, wherein the compensation circuit is configured to conduct a charging operation to charge at least one of the first bitline and the second bitline,
wherein, at the end of the charging operation, a voltage difference between near-ends of the first bitline and the second bitline is larger than the input-referred offset voltage of the amplification circuit.

44. The sense amplifier circuit of claim 43, wherein, at the end of the charging operation, the voltage difference between the near-ends of the first bitline and the second bitline is 10%-40% larger than the input-referred offset voltage of the amplification circuit.

45. The sense amplifier circuit of claim 43, wherein in the offset compensation stage, remain on a connection between the first bitline and the first node, remain on a connection between the second bitline and the second node until an amount of charges injected into the first bitline and the second bitline is equal to a pre-calculated amount of charges that is able to compensate an input-referred offset voltage of the amplification circuit;
switch off the connection between the first bitline and the first node, and switch off the connection between the second bitline and the second node.

46. A sense amplifier circuit, comprising:
an amplification circuit, comprising:
a first inverting amplifier and a second inverting amplifier, wherein an input of the first inverting amplifier is connected to an output of the second inverting amplifier at a first node, and an input of the second inverting amplifier is connected to an output of the first inverting amplifier at a second node, wherein the first inverting amplifier comprises a first transistor and a second transistor, a gate terminal of the first transistor and a gate terminal of the second transistor are directly connected together to form the input of the first inverting amplifier at the first node; the second inverting amplifier comprises a third transistor and a fourth transistor, and a gate terminal of the third transistor and a gate terminal of the fourth transistor are directly connected together to form the input of the second inverting amplifier at the second node; and
a compensation circuit coupled to the amplification circuit and configured to:
in an offset compensation stage, switch off a connection between the first bitline and the second node, and switch off a connection between the second bitline and the first node, at least remain on a connection between the first bitline and the first node or remain on a connection between the second bitline and the second node, wherein the first inverting amplifier and the second inverting amplifier are cross-coupled during the offset compensation stage.

47. The sense amplifier circuit of claim 46, wherein during a signal amplification stage, an output of the first inverting amplifier is connected to the first bitline, and an output of the second inverting amplifier is connected to the second bitline, and wherein during the offset compensation stage, the output of the first inverting amplifier is connected to the second bitline, and the output of the second inverting amplifier is connected to the first bitline.

48. The sense amplifier circuit of claim 46, wherein in the offset compensation stage, remain on a connection between the first bitline and the first node, remain on a connection between the second bitline and the second node until an amount of charges injected into the first bitline and the second bitline is equal to a pre-calculated amount of charges that is able to compensate an input-referred offset voltage of the amplification circuit;

switch off the connection between the first bitline and the first node, and switch off the connection between the second bitline and the second node.

49. A sense amplifier circuit, comprising:
an amplification circuit, comprising:
a first inverting amplifier connected to a first bitline; and
a second inverting amplifier connected to a second bitline, wherein the amplification circuit is configured to amplify a voltage signal applied between the first bitline and the second bitline; and a compensation circuit coupled to the amplification circuit and configured to compensate an input-referred offset voltage of the amplification circuit, wherein the compensation circuit is configured to conduct a charging operation to charge at least one of the first bitline and the second bitline, and wherein, at the end of the charging operation, a voltage difference between near-ends of the first bitline and the second bitline is larger than the input-referred offset voltage of the amplification circuit;

wherein after a distribution of charges on bitlines is settled, a compensation voltage generated by charges distributed on the first bitline and the second bitline is within ±10% of an input-referred offset voltage of an amplification circuit.

* * * * *